United States Patent
Chang et al.

(10) Patent No.: US 9,899,288 B2
(45) Date of Patent: Feb. 20, 2018

(54) INTERCONNECT STRUCTURES FOR WAFER LEVEL PACKAGE AND METHODS OF FORMING SAME

(71) Applicant: Taiwan Semiconductor Manufacturing Company, Ltd., Hsinchu (TW)

(72) Inventors: Chih-Hao Chang, Xinpu Township (TW); Tsung-Hsien Chiang, Hsinchu (TW); Guan-Yu Chen, Hsinchu (TW); Wei Sen Chang, Jinsha Township (TW); Tin-Hao Kuo, Hsinchu (TW); Hao-Yi Tsai, Hsinchu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/591,403

(22) Filed: May 10, 2017

(65) Prior Publication Data
US 2017/0243800 A1    Aug. 24, 2017

Related U.S. Application Data

(60) Division of application No. 15/052,105, filed on Feb. 24, 2016, now Pat. No. 9,659,896, which is a
(Continued)

(51) Int. Cl.
H01L 23/498    (2006.01)
H01L 23/31     (2006.01)
(Continued)

(52) U.S. Cl.
CPC ........ *H01L 23/3135* (2013.01); *H01L 23/293* (2013.01); *H01L 23/49816* (2013.01);
(Continued)

(58) Field of Classification Search
CPC . H01L 21/563; H01L 23/3114; H01L 23/481; H01L 21/486; H01L 23/3135;
(Continued)

(56) References Cited

U.S. PATENT DOCUMENTS 6,555,906 B2    4/2003    Towle et al.
7,619,901 B2    11/2009    Eichelberger et al.
(Continued)

FOREIGN PATENT DOCUMENTS

KR    1020080094251 A    10/2008

*Primary Examiner* — Caleen Sullivan
(74) *Attorney, Agent, or Firm* — Slater Matsil, LLP

(57) ABSTRACT

A device package is provided. The device package includes a first die and a second die. A top surface of the first die is offset from a top surface of the second die in a direction that is parallel to a sidewall of the first die. A molding compound extends along sidewalls of the first die and the second die, where at least a portion of a top surface of the molding compound includes an inclined surface. A polymer layer contacts the top surface of the molding compound, the top surface of the first die, and the top surface of the second die. A top surface of the polymer layer is substantially level. A first conductive feature is in the polymer layer, where the first conductive feature is electrically connected to the first die.

20 Claims, 29 Drawing Sheets

Related U.S. Application Data continuation-in-part of application No. 14/464,487, filed on Aug. 20, 2014, now Pat. No. 9,484,285.

(51) Int. Cl.
  *H01L 23/538* (2006.01)
  *H01L 23/29* (2006.01)
  *H01L 25/065* (2006.01)

(52) U.S. Cl.
  CPC .. *H01L 23/49827* (2013.01); *H01L 23/49838* (2013.01); *H01L 23/5389* (2013.01); *H01L 25/0655* (2013.01)

(58) Field of Classification Search
  CPC ............. H01L 23/293; H01L 23/49838; H01L 25/0655; H01L 23/5389; H01L 23/49816; H01L 23/49827
  USPC ........................................................ 257/774
  See application file for complete search history.

(56) References Cited

U.S. PATENT DOCUMENTS

| | | |
|---|---|---|
| 7,642,128 B1 | 1/2010 | Lin et al. |
| 8,097,490 B1 | 1/2012 | Pagaila et al. |
| 8,133,762 B2 | 3/2012 | Pagaila et al. |
| 8,193,604 B2 | 6/2012 | Lin et al. |
| 8,354,304 B2 | 1/2013 | Chow et al. |
| 8,474,133 B2 | 7/2013 | Eichelberger et al. |
| 8,742,579 B2 | 6/2014 | Pagaila et al. |
| 8,796,846 B2 | 8/2014 | Lin et al. |
| 2005/0027098 A1 | 2/2005 | Hayes |
| 2005/0121765 A1 | 6/2005 | Lin |
| 2008/0316714 A1 | 12/2008 | Eichelberger et al. |
| 2009/0166785 A1 | 7/2009 | Camacho et al. |
| 2009/0224402 A1 | 9/2009 | Do et al. |
| 2009/0261358 A1 | 10/2009 | Chitnis et al. |
| 2010/0072599 A1 | 3/2010 | Camacho et al. |
| 2010/0148360 A1 | 6/2010 | Lin et al. |
| 2010/0258944 A1 | 10/2010 | Uchiyama et al. |
| 2011/0193216 A1 | 8/2011 | Lin et al. |
| 2011/0221041 A1 | 9/2011 | Lin et al. |
| 2012/0012991 A1 | 1/2012 | Chandrasekaran et al. |
| 2012/0119378 A1 | 5/2012 | Ng et al. |
| 2012/0217643 A1 | 8/2012 | Pagaila et al. |
| 2012/0267777 A1 | 10/2012 | Haba et al. |
| 2012/0319284 A1 | 12/2012 | Ko et al. |
| 2013/0049214 A1 | 2/2013 | Nikitin et al. |
| 2013/0264684 A1 | 10/2013 | Yu et al. |
| 2014/0054760 A1 | 2/2014 | Yu et al. |
| 2014/0203443 A1 | 7/2014 | Pagaila et al. |
| 2014/0225222 A1 | 8/2014 | Yu et al. |
| 2014/0252572 A1 | 9/2014 | Hou et al. |
| 2015/0200188 A1 | 7/2015 | Yu et al. |
| 2015/0221578 A1 | 8/2015 | Mahler |
| 2016/0056056 A1 | 2/2016 | Chen et al. |

INTERCONNECT STRUCTURES FOR WAFER LEVEL PACKAGE AND METHODS OF FORMING SAME

This application is a divisional of U.S. application Ser. No. 15/052,105, filed on Feb. 24, 2016, which is a continuation in part of U.S. application Ser. No. 14/464,487, filed on Aug. 20, 2014, now U.S. Pat. No. 9,484,285. These applications are hereby incorporated herein by reference.

BACKGROUND

In an aspect of conventional packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B through 13 illustrate cross-sectional views of intermediary steps of manufacturing a device package in accordance with some embodiments.

DETAILED DESCRIPTION

Figure 1A:
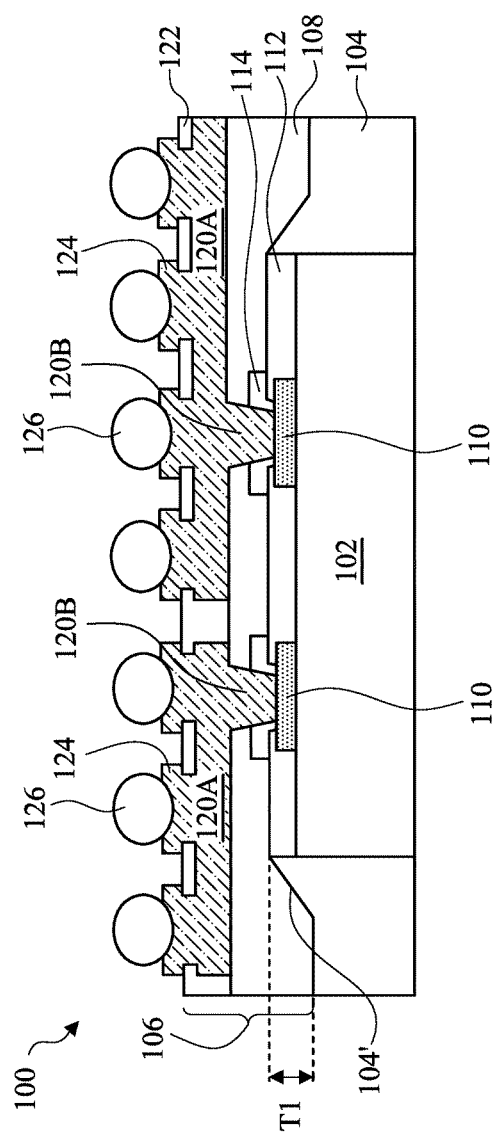
FIGS. 1A and 1B illustrate cross-sectional views of a device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, a new structure and method for polymer film coating (e.g., for redistribution layer (RDL) structures) on a molding compound surface is disclosed, which simplifies package processing and reduces process costs.

Described below is a method for forming a fan-out package and corresponding structure. In some embodiments, a molding compound is formed around a die using a transfer molding process. After the molding compound is formed, a top surface of a die may remain exposed. Thus, a grinding process (or other etch back technique) need not be performed on the molding compound to expose the die. Due to the transfer molding process, a top surface of the molding compound may have a total thickness variation (TTV, e.g., distance between a highest point and a lowest point of the top surface) of about 5 µm to about 10 µm. A polymer layer (e.g., a first RDL) is formed over the molding compound and the die using a lamination process (e.g., vacuum lamination, heat roll lamination, or the like). The lamination process may further include planarizing a top surface of the polymer layer through pressure clamping, for example. Various conductive features (e.g., conductive lines and/or vias) and/or additional RDL layers are subsequently formed over the polymer layer. Thus, fan-out RDL structure may be formed over a die and molding compound using transfer molding and lamination processes, which may reduce overall costs of manufacturing the package.

FIG. 1A illustrates a cross-sectional view of a fan-out device package 100 in accordance with various embodiments. Package 100 includes a die 102, a molding compound 104 disposed around the die, and RDLs 106 (e.g., having conductive features 120) formed over die 102 and molding compound 104. Die 102 may be a semiconductor die and could be any type of integrated circuit, such as a processor, logic circuitry, memory, analog circuit, digital circuit, mixed signal, and the like. Die 102 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the interconnect structure. For example, contact pads 110 may be formed over the interconnect structure and may be electrically connected to the active devices through the various conductive features in the interconnect structure. Contact pads 110 may comprise a conductive material such as aluminum, copper, and the like. Furthermore, a passivation layer 112 may be formed over the interconnect structure and the contact pads. In some embodiments, passivation layer 112 may be formed of non-organic materials such as silicon oxide, un-doped silicate glass, silicon oxynitride, and the like. Other suitable passivation materials may also be used. Portions of passivation layer 112 may cover edge portions of the contact pads 110.

Figure 1B:
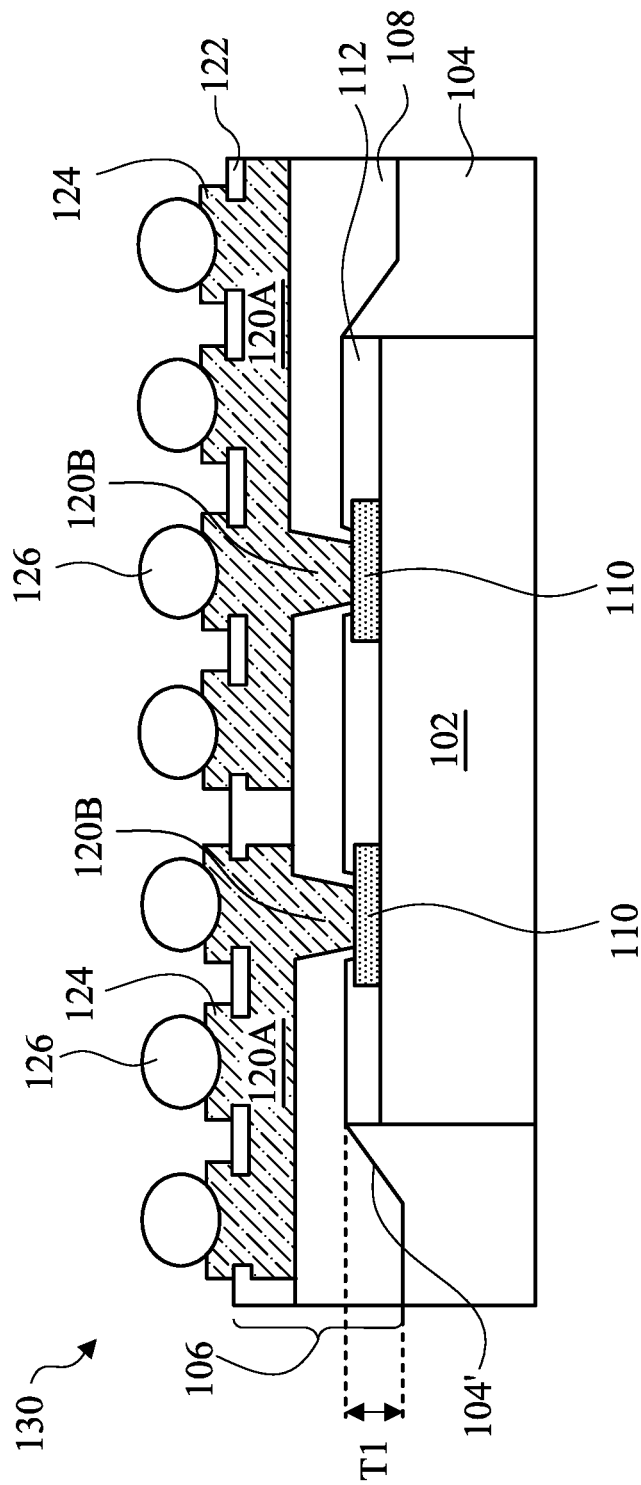

Additional interconnect features, such as additional passivation layers, conductive pillars, and/or under bump metallurgy (UBM) layers, may also be optionally formed over contact pad 110. For example, package 100 of FIG. 1A includes an UBM layer 114 over contact pad 110. UBM layer 114 may extend over and cover portions of passivation layer 112. In contrast, FIG. 1B illustrates a package 150 where UBM layer 114 is omitted. The various features of dies 102 may be formed by any suitable method and are not described in further detail herein. Furthermore, the general features and configuration of dies 102 described above are but one example embodiment, and dies 102 may include any combination of any number of the above features as well as other features.

Molding compound 104 is disposed around die 102. For example, in a top down view of molding compound 104/die 102 (not illustrated), molding compound 104 may encircle die 102. As will be described in greater detail in subsequent paragraphs, molding compound 104 may be formed using a transfer molding process, which does not cover a top surface of die 102. As a result of the transfer molding process, a top surface of molding compound 104 may not be substantially level. For example, molding compound 104 may include an inclined, recessed surface 104' against sidewalls of die 102. While FIG. 1A illustrates the inclined surface 104' as having a substantially linear profile, in other embodiments, surface 104' may be non-linear (e.g., concave or convex). Other portions of the top surface of molding compound 104 may include similar variations in angle and height. In various embodiments, a TTV T1 of a top surface of molding compound 104 may be about 5 μm to about 10 μm.

One or more RDLs 106 may be formed over die 102 and molding compound 104. RDLs 106 may extend laterally past edges of die 102 to provide fan-out interconnect structures. RDLs 106 may include a bottom-most polymer layer 108 having a bottom surface contacting top surfaces of die 102 and molding compound 104. As will be explained subsequently in greater detail, polymer layer 108 may be formed using a lamination process such as vacuum lamination, heat press lamination, or the like. In some embodiments, polymer layer 108 may comprise polyimide, polybenzoxazole (PBO), epoxy, an underfill film, a molded underfill film, or any other suitable lamination film material. Polymer layer 108 may or may not comprise any filler materials such as silica filler, glass filler, aluminum oxide, silicon oxide, and the like. Furthermore, a top surface of polymer layer 108 may be substantially level due to pressure clamping during the lamination process and/or a separate pressure clamping process. For example, a TTV of a top surface of polymer layer 108 may be less than about 5 μm to provide a suitable surface for forming additional features of RDLs 106. In contrast, a bottom surface of polymer layer 108 may not be substantially level. For example, a bottom surface of polymer layer 108 in contact with molding compound 104 and may have a TTV T1 of about 5 μm to about 10 μm.

RDLs 106 may further include conductive features 120 (e.g., conductive lines 120A and conductive vias 120B) and additional polymer layers 122. Conductive lines 120A may be formed over polymer layer 108, and conductive vias 120B may extend through polymer layer 108 and electrically connect to contact pads 110 of die 102. Polymer layer 122 may also be formed over polymer layer 108. In various embodiments, polymer layer 122 may be lamination film material similar to polymer layer 108, which may be formed using a similar lamination process. Alternatively, polymer layer 122 may comprise another polymer material comprising, for example, polyimide (PI), PBO, benzocyclobuten (BCB), epoxy, silicone, acrylates, nano-filled pheno resin, siloxane, a fluorinated polymer, polynorbornene, and the like formed using any suitable means such as spin-on techniques, and the like. RDLs 106 may further include any number of additional polymer layers having conductive features disposed therein (not shown) over polymer layer 122 and conductive features 120 based on package design.

Additional package features, such as external connectors 126 may be disposed over RDLs 106. Connectors 126 may be ball grid array (BGA) balls, controlled collapse chip connector (C4) bumps, and the like disposed on under metal metallurgies (UBMs) 124, which may be formed over RDLs 106. Connectors 126 may be electrically connected to die 102 by way of RDLs 106. Connectors 126 may be used to electrically connect package 100 to other package components such as another device die, interposers, package substrates, printed circuit boards, a mother board, and the like.

Figure 2A:
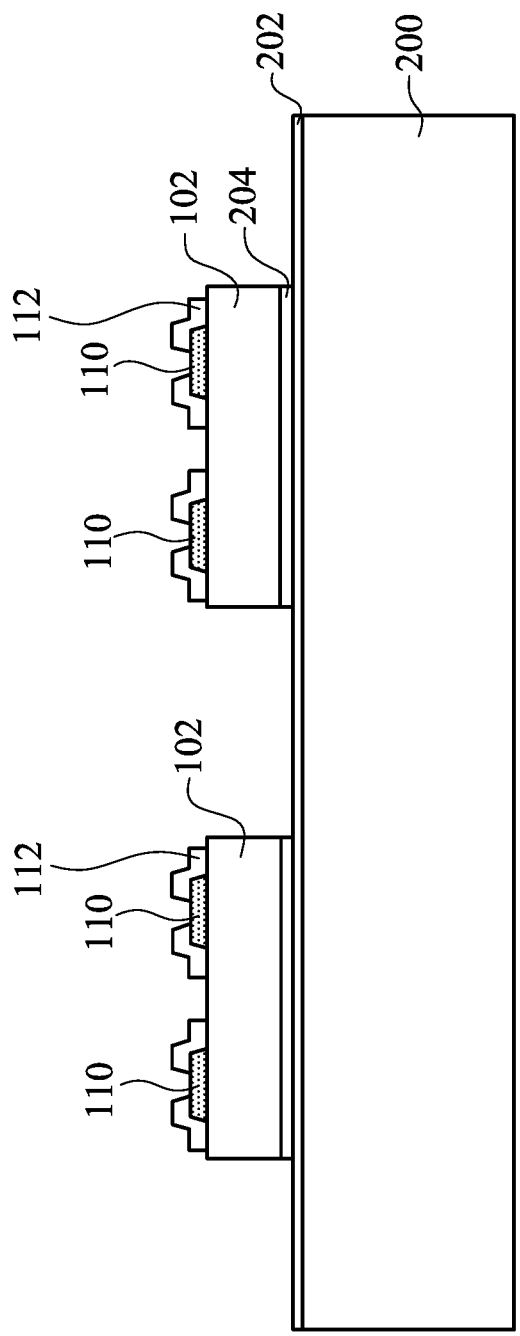

FIGS. 2A and 2B through 5 illustrate cross-sectional views of various intermediary stages of forming molding compound 104 and polymer layer 108 in accordance with various embodiments. Referring to FIG. 2A, dies 102 are disposed mounted on a carrier 200. Generally, the carrier 200 provides temporary mechanical and structural support to the dies 102 during subsequent processing steps. In this manner, damage to dies 102 is reduced or prevented. Carrier 200 may comprise, for example, glass, silicon oxide, aluminum oxide, and the like. A temporary adhesive layer 202 (e.g., a glue layer, a light-to-heat conversion (LTHC) coating, an ultraviolet (UV) film, and the like) is disposed over carrier 200. Dies may be temporarily affixed to carrier 200 using a combination of adhesive layer 202 and/or an additional adhesive layer 204 (e.g., a die attach film (DAF)) disposed on a backside of dies 102.

Figure 2B:
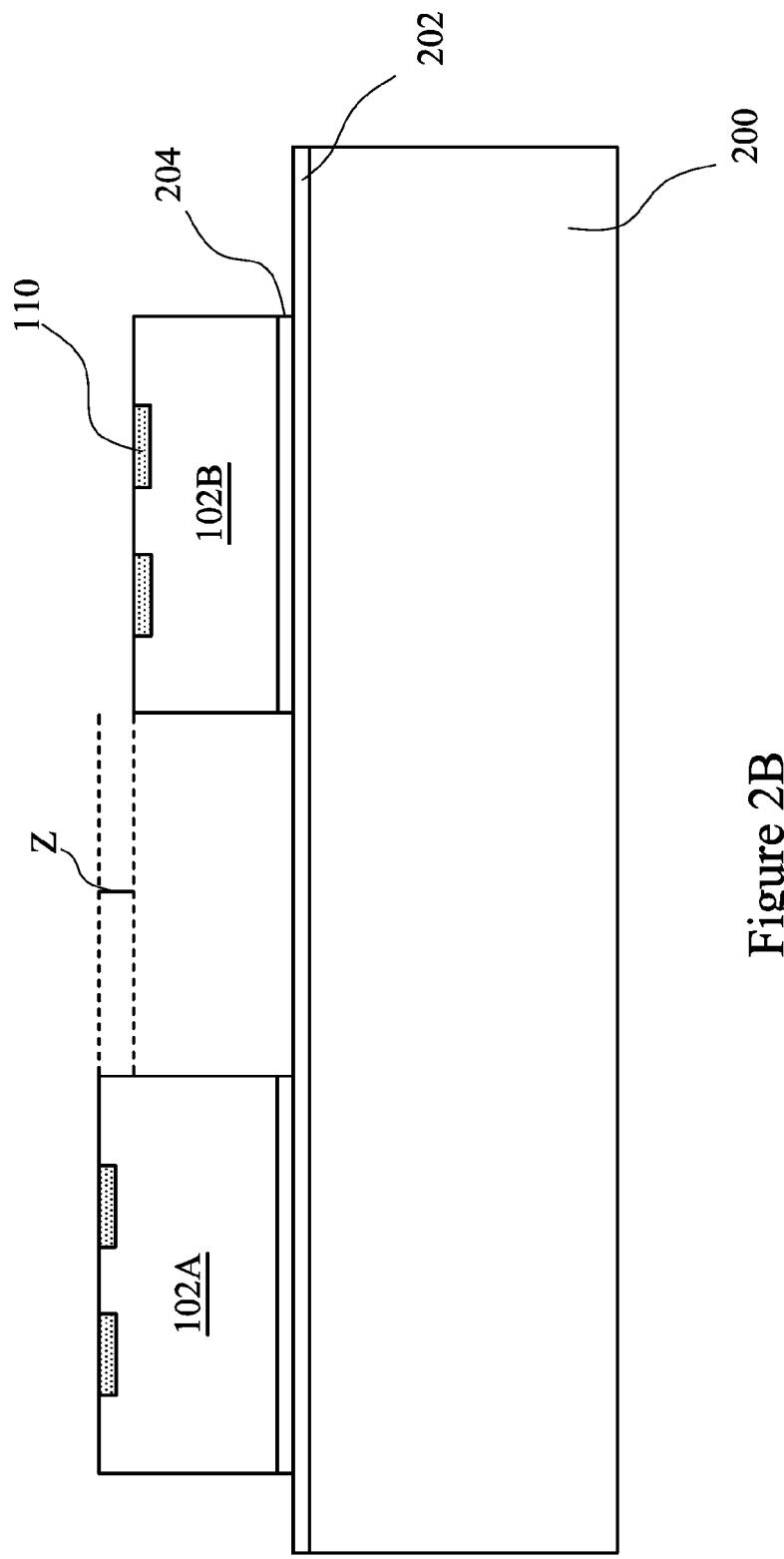

In some embodiments, dies 102 may include a first die 102A and a second die 102B, where first die 102A has a different dimension than second die 102B. This is depicted in FIG. 2B. For example, first die 102A may have a different height, width, or length from second die 102B. Two dies 102 may have a height difference Z between an uppermost surface of a top surface of first die 102A and an uppermost surface of a top surface of second die 102B, where height is measured along a sidewall of the dies 102 in a direction from the carrier 200 to a furthermost surface of a die 102. In some embodiments, the height difference may be about 2 µm or more.

In some embodiments, first die 102A is a same type of die as second die 102B. For example, manufacturing processes may result in two dies 102 that are built using similar processes but that have different heights. In some embodiments, first die 102A is a different type of die than second 102B and may be manufactured using the same or different manufacturing processes. For example, first die 102A may have different devices and circuits than second die 102B, and/or may be used for a different function than second die 102B.

In some embodiments, as shown in FIG. 2B, a top surface of contact pads 110 of a die 102 may be level with a top surface of the die 102 in which it is disposed. In other embodiments, contact pads 110 are disposed on a top surface of a die 102, for example as depicted in FIG. 2A.

Figure 3:
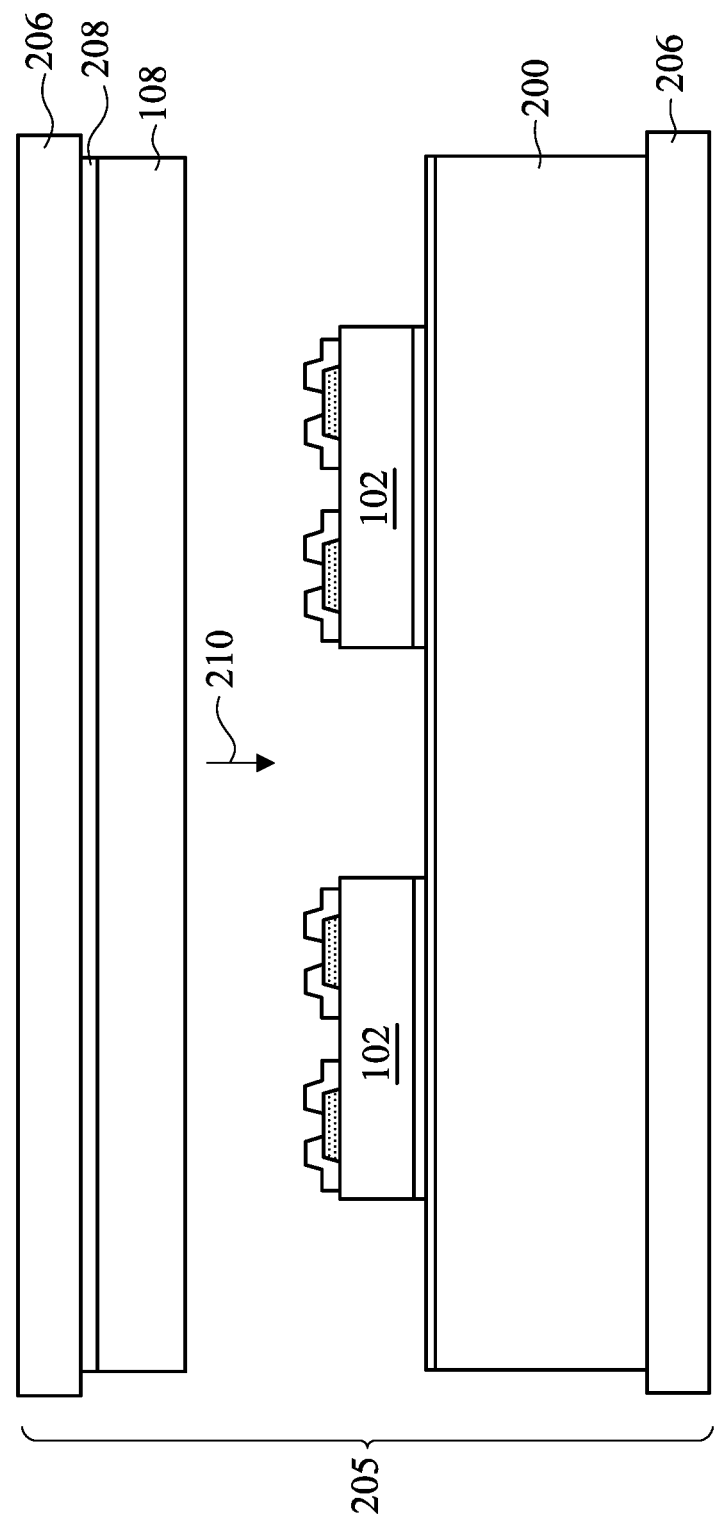
Figure 4:
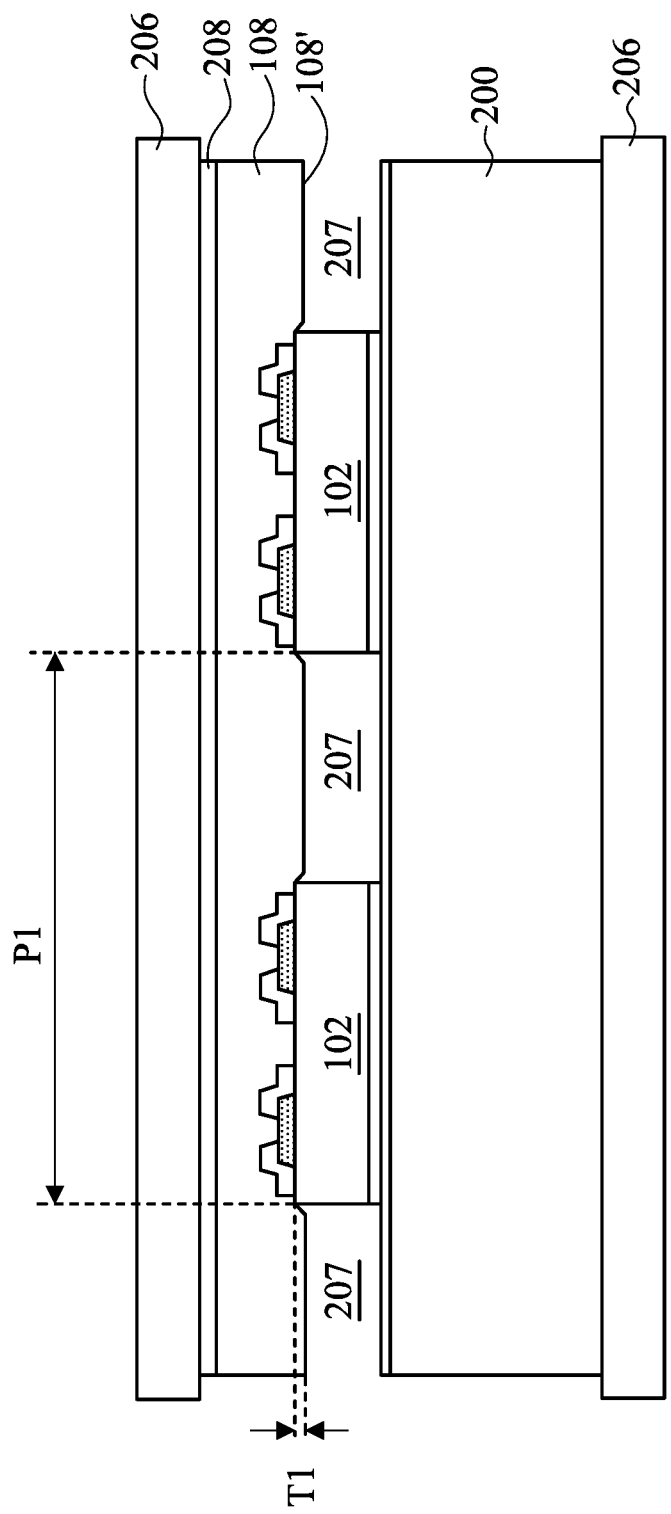

FIGS. 3 and 4 illustrate the formation of polymer layer 108 over dies 102 using a vacuum lamination process, for example. Referring first to FIG. 3, carrier 200 (having dies 102 mounted thereto) is disposed between top and bottom plates 206 of a molding apparatus 205. Top and bottom plates 206 may comprise a suitable material for providing structural support such as a metal, ceramic, or the like. A release film 208 may be disposed on a bottom surface of top plate 206, and polymer layer 108 may be disposed on a bottom surface of release film 208. In some embodiments, release film 208 comprises polyethylene terephthalate (PET), teflon, or any other material that can temporary support polymer layer 108 and be removed from polymer layer 108 after the formation of various features.

Polymer layer 108 may be disposed on a bottom surface of release film 208 (e.g., facing dies 102). Polymer layer 108 may comprise a lamination film material, such as polyimide, PBO, epoxy, an underfill film, a molded underfill film, and the like either with or without a filler material. Polymer layer 108 may be adhered to the bottom surface of release film 208 by a relatively weak bond. For example, prior to its placement on dies 102, polymer layer 108 may be uncured or only partially cured. Subsequently, top and/or bottom plates 206 may be moved to contact a bottom surface of polymer layer 108 to top surfaces of dies 102 as indicated by arrow 210, for example.

FIG. 4 illustrates molding apparatus 205 after polymer layer 108 is disposed on top surfaces of dies 102. Polymer layer 108 may cover top surfaces of dies 102 (e.g., covering contact pads 110 and passivation layer 112). Polymer layer 108 may not extend extensively past top surfaces of dies 102. For example, gaps 207 may remain disposed between dies 102 under polymer layer 108. Furthermore, the lack of any support material under polymer layer 108 may result in a bottom surface of polymer layer 108 not being substantially level. For example, a bottom surface of polymer layer 108 (labeled 108') may have a TTV T1 of about 5 µm to about 10 µm. TTV T1 may be a variable of the spacing of dies 102 (e.g., pitch P1) and the corresponding lateral size of gaps 207. For example, in embodiments where spacing P1 is about 100 µm to about 200 µm, TTV T1 may be smaller (e.g., about 5 µm). As another example, in embodiments where pitch P1 is about 1 mm to about 2 mm, TTV T1 may be larger (e.g., about 10 µm).

After polymer layer 108 is disposed on dies 102, a curing process may be performed to adhere polymer layer 108 to top surfaces of die 102. For example, in some embodiments, polymer layer 108 may be cured at a temperature of about 25° Celsius to about 175° Celsius for about 30 second to about 10 minutes. The curing process may vary depending on the material of polymer layer 108. In various embodiments, sufficient pressure is applied (e.g., by top and/or bottom plates 206) to polymer layer 108 so that a top surface of polymer layer 108 is substantially level (e.g., having a TTV less than about 5 µm).

Figure 5:
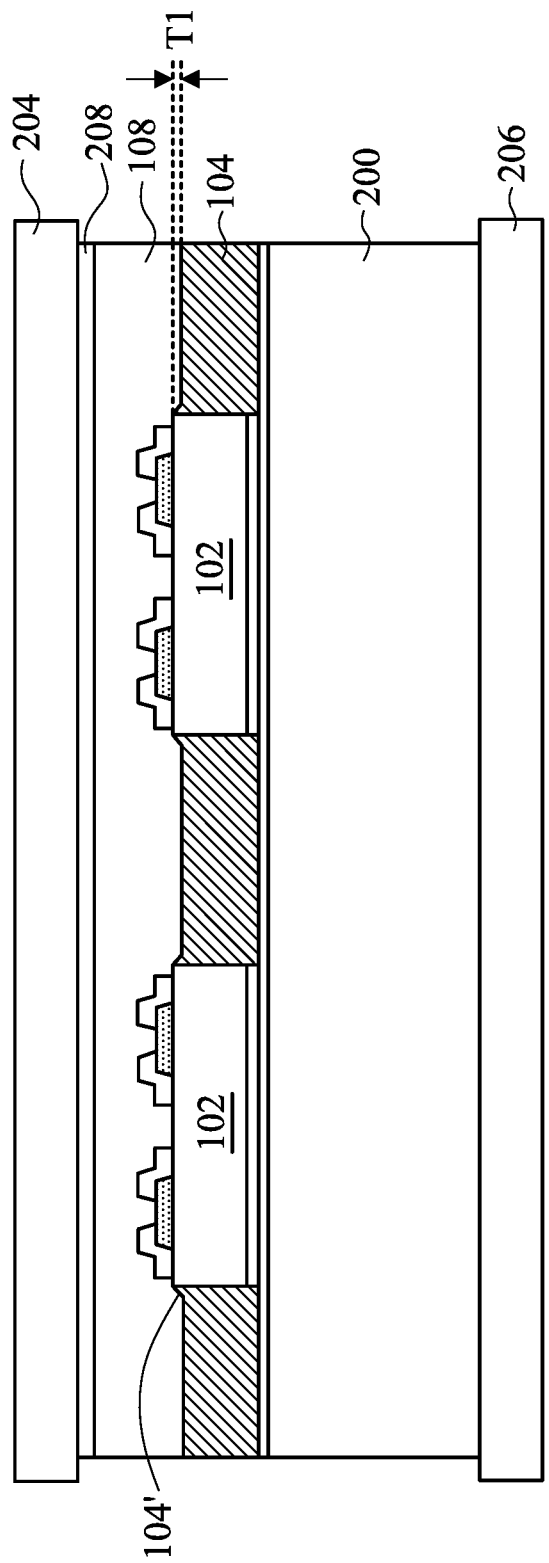

Next in FIG. 5, molding compound 104 is formed in gaps 207 using a transfer molding process, for example. Polymer layer 108 may be used as a film layer that covers top surfaces of dies 102 (e.g., covering contact pads 110 and passivation layer 112) during the molding process. Molding compound 104 comprises a suitable material such as an epoxy resin, a molding underfill, and the like. In some embodiments, the transfer molding process includes dispensing molding compound 104 between dies 102 (e.g., in gaps 207) in liquid form. Next, a curing process may be performed to solidify molding compound 104. A top surface of molding compound 104 may contact the bottom surface of polymer layer 108, and thus a top surface of molding compound 104 may have a similar profile as the bottom surface of polymer layer 108. For example, a top surface of molding compound 104 may include an inclined, recessed surface 104' against sidewalls of dies 102. Other portions of the top surface of molding compound 104 may include similar variations in angle and/or height. In various embodiments, a TTV T1 of a top surface of molding compound 104 (and corresponding bottom surface of polymer layer 108) may be about 5 µm to about 10 µm. Thus, molding compound 104 and polymer layer 108 may be formed in package 100 using lamination and transfer molding processes.

FIGS. 2 through 5 illustrate the formation of polymer layer 108 prior to molding compound 104 in accordance with some embodiments. In alternative embodiments, an alternative order of forming various elements in package 100 may be employed. For example, FIGS. 6 to 8 illustrate forming polymer layer 108 after molding compound 104.

Figure 6:
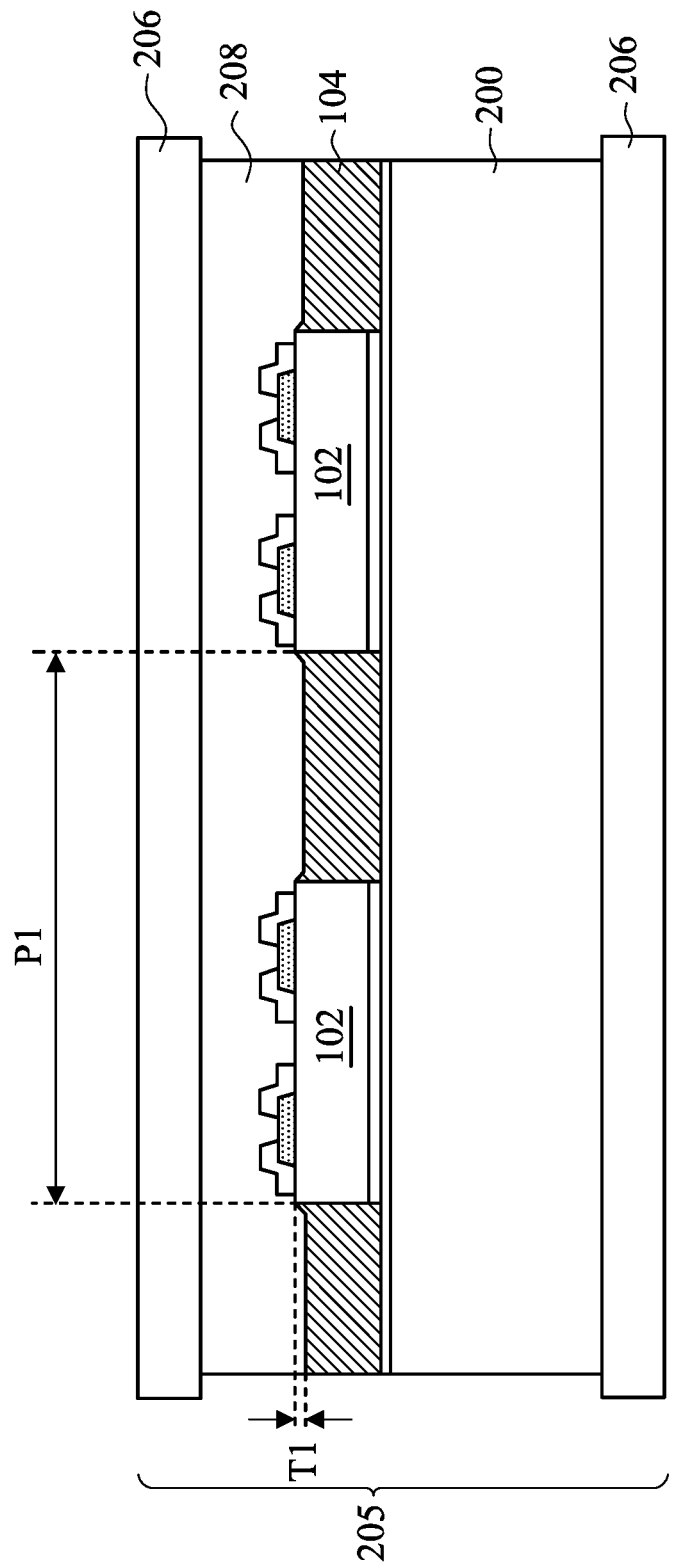

In FIG. 6, molding compound 104 is dispensed around between dies 102 prior to the formation of polymer layer 108. For example, dies 102 (supported by carrier 200) may be placed on bottom plate 206 of a molding apparatus 205 and release film 208 (e.g., supported by top plate 206) may be used to cover top surfaces of dies 102 during transfer molding. Molding compound 104 may be dispensed in liquid form between dies 102 and then cured. As a result of the transfer molding process, a top surface of molding compound 104 may not be substantially level (e.g., having a TTV T1 of about 5 µm to about 10 µm) and may have inclined and/or recessed portions 104', for example. TTV T1 may vary depending on the spacing P1 of dies 102.

Figure 7:
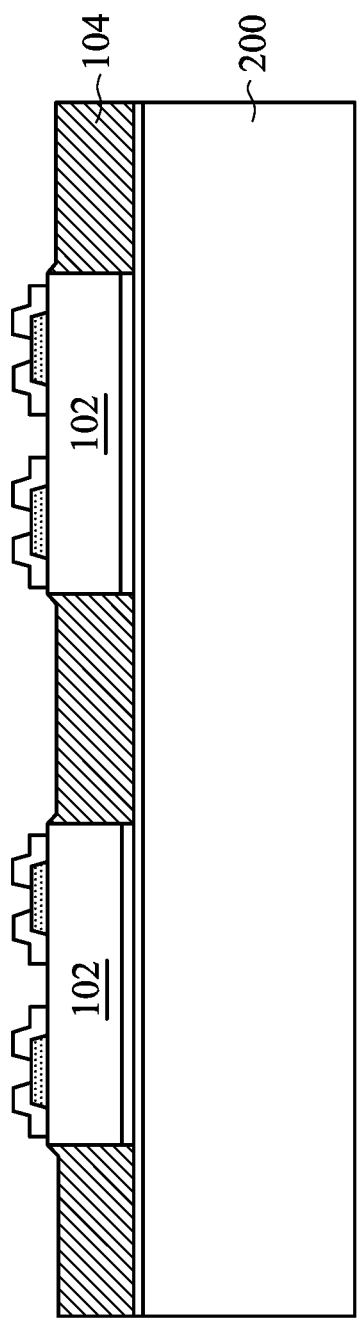

Next, as illustrated by FIG. 7, top and bottom plates 206 as well as release film 208 are removed from dies 102 and carrier 200. For example, release film 208 may comprise a material that has a relatively weak adhesive bond with molding compound 104, and release film 208 (and attached top plate 206) may be removed using mechanical force. For example, release film 208 may comprise PET, Teflon, and the like. Due to the placement of release film 208, molding compound 104 may be formed around dies 102 without covering a top surface of dies 102. Thus, additional process (e.g., grinding) need not be performed to expose features of dies 102 (e.g., contact pads 110), thereby saving process costs.

Figure 8:
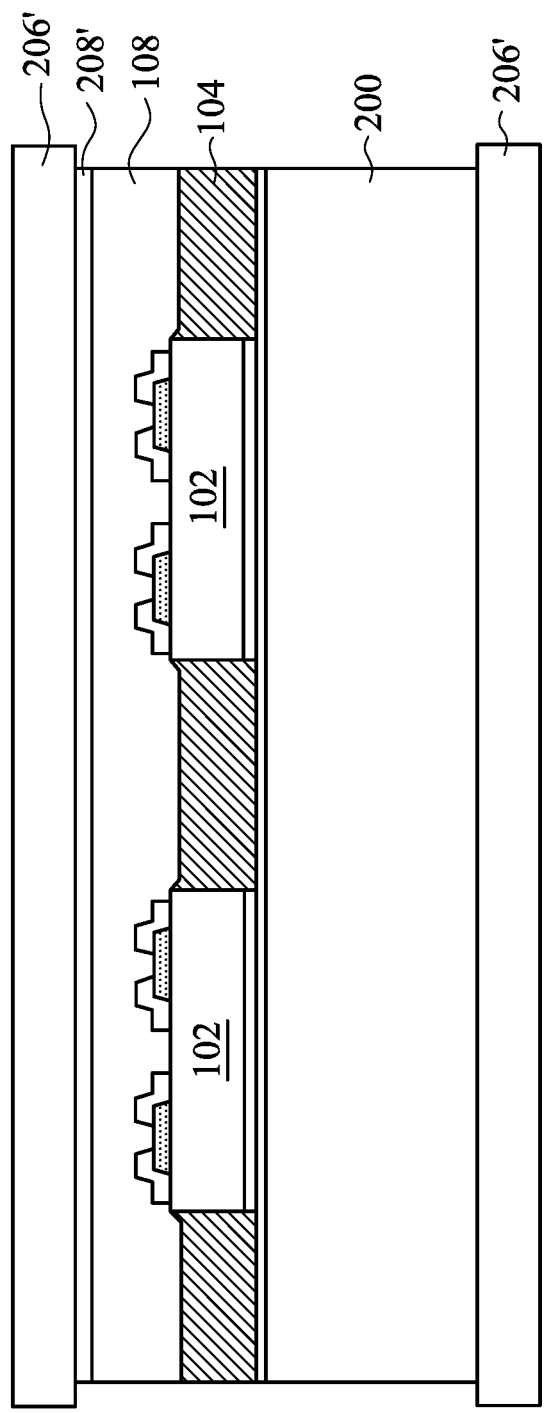

In FIG. 8, polymer layer 108 is formed over dies 102 and molding compound 104 using a suitable lamination process. For example, dies 102 (supported by carrier 200) may be placed between top and bottom plates 206'. Top and bottom plates 206' may be the same supports as top/bottom plates 206 of molding apparatus 205, or top and bottom plates 206' may be features of another processing apparatus (e.g., a lamination tool). Top and bottom plates 206' may be used to place a polymer layer 108 over dies 102 and molding compound 104. A release film 208' may be disposed between polymer layer 108 and top plate 206'. Alternatively, a heat roll lamination process (e.g., involving a rolling apparatus, not shown) may be used to roll polymer layer 108 on dies 102 and molding compound 104.

After polymer layer 108 is disposed on dies 102/molding compound 104, a curing process may be performed to adhere polymer layer 108 to top surfaces of die 102 and molding compound 104. For example, polymer layer 108 may be cured at a temperature of about 25° Celsius to about 175° Celsius for about 30 second to about 10 minutes. Pressure clamping (e.g., by applying a suitable amount of pressure using top and/or bottom plates 206') is applied to polymer layer 108 to level a top surface of polymer layer 108. For example, after pressure clamping, the top surface of polymer layer 108 may have a TTV less than about 5 µm, which may be a suitable TTV for reliably forming additional RDL features (e.g., conductive features and/or additional polymer layers) over polymer layer 108. Furthermore, in some embodiments, a high temperature film (e.g., a high temperature PBO film, not shown) may optionally be disposed over polymer layer 108, cured, and planarized (e.g., using a pressure clamping process). The pressure clamping process may be applied to the high temperature film when the high temperature film is partially cured (e.g., about 50% to about 70%) cured.

Figure 9:
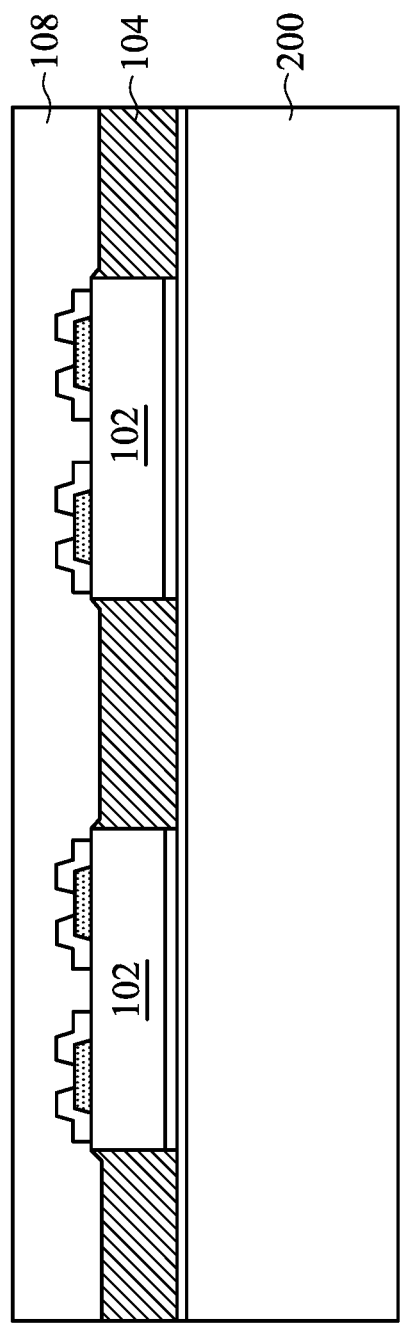
Figure 10:
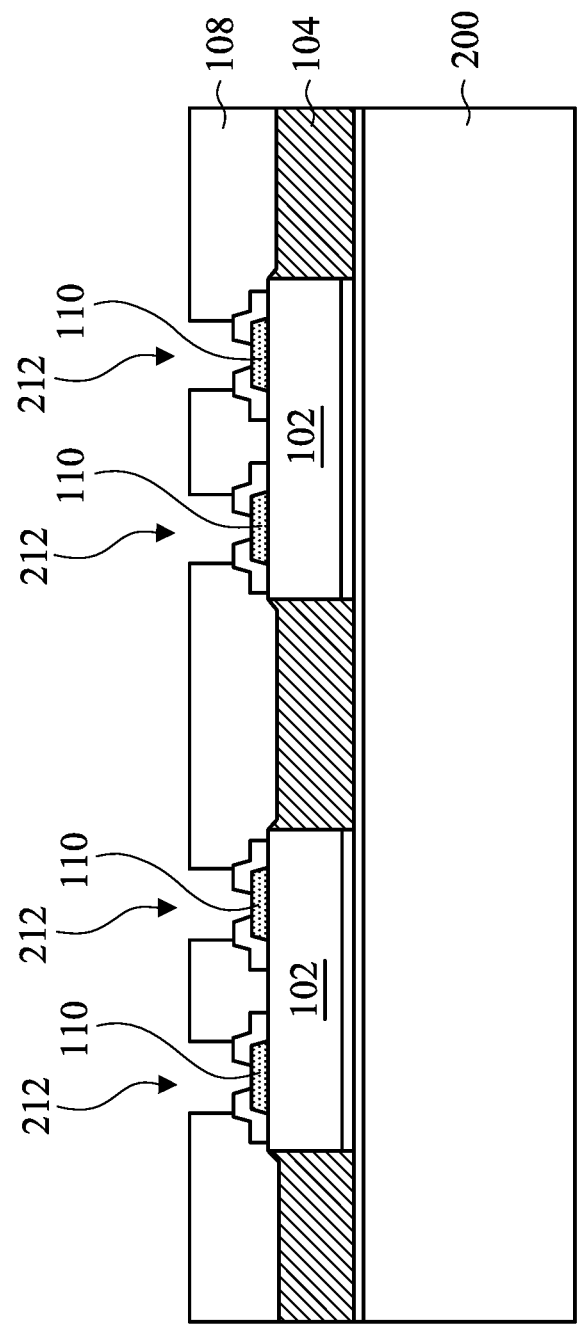

In FIG. 9, dies 102 having molding compound 104 and polymer layer 108 formed thereon are removed from top and bottom plate 206. Release film 208 may aid in the removal of top and bottom plates 206 using mechanical force. For example, release film 208 may comprise a material (e.g., PET, Teflon, and the like) that does not have high adhesion with polymer layer 108, and release film 208 may be removed using mechanical force without damaging other features of the device package. Next in FIG. 10, openings 212 are formed in polymer layer 108 to expose contact pads 110 using any suitable process, such as photolithography, laser drilling, and/or etching techniques, for example.

Figure 11:
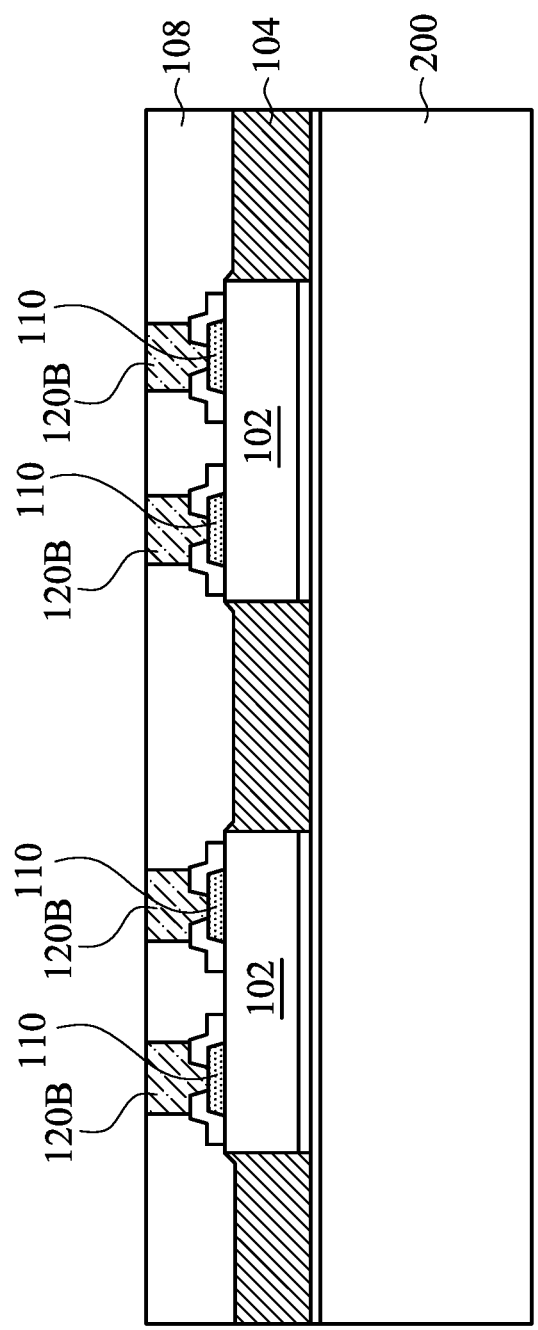
Figure 12:
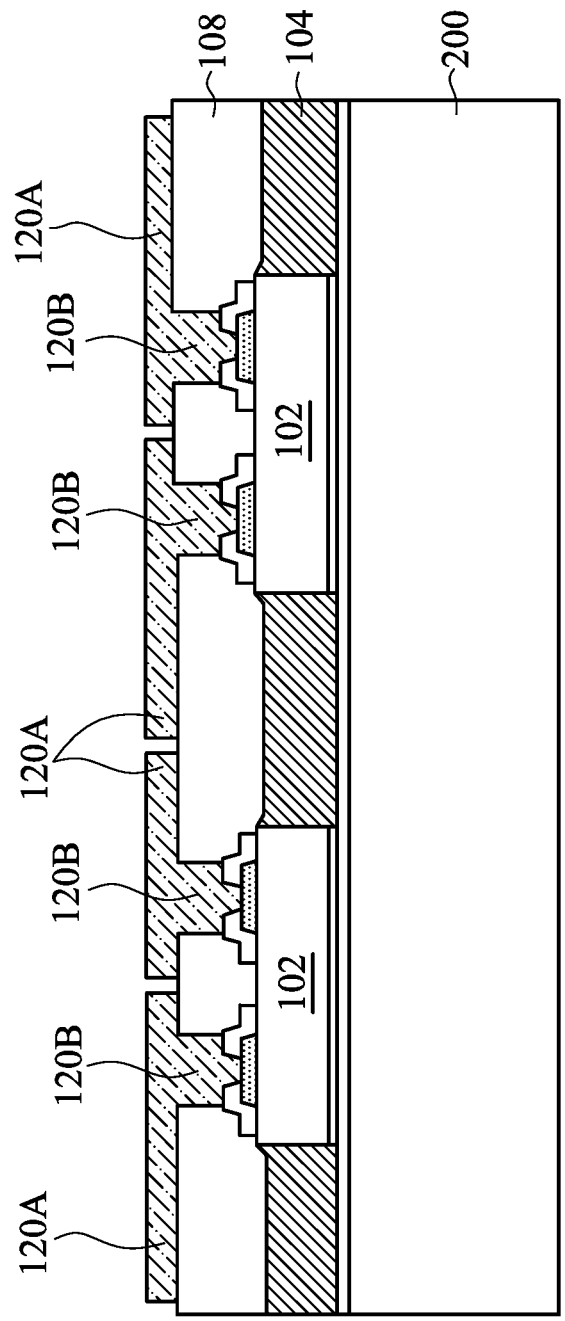

FIGS. 11 and 12 illustrate the formation of various conductive features 120, such as conductive vias 120B and conductive lines 120A. First, in FIG. 11, openings 212 are filled with a conductive material (e.g., copper, silver, gold, and the like) to form conductive vias 120B. The filling of openings 212 may include first depositing a seed layer (not shown) and electro-chemically plating openings 212 with the conductive material. The conductive material may overfill openings 212, and a chemical mechanical polish (CMP) or other etch back technique may be performed to remove excess portions of the conductive material over polymer layer 108. Conductive vias 120B may electrically connect to contact pads 110 of dies 102.

Next, in FIG. 12, conductive lines 120A (e.g., comprising copper, silver, gold, and the like) are formed over polymer layer 108. The formation of conductive lines 120A may include depositing a seed layer (not shown), using a mask layer (not shown) having various openings to define the shape of conductive lines 120A, and filling the openings in the mask layer using an electro-chemical plating process, for example. The mask layer may then be removed.

Figure 13:
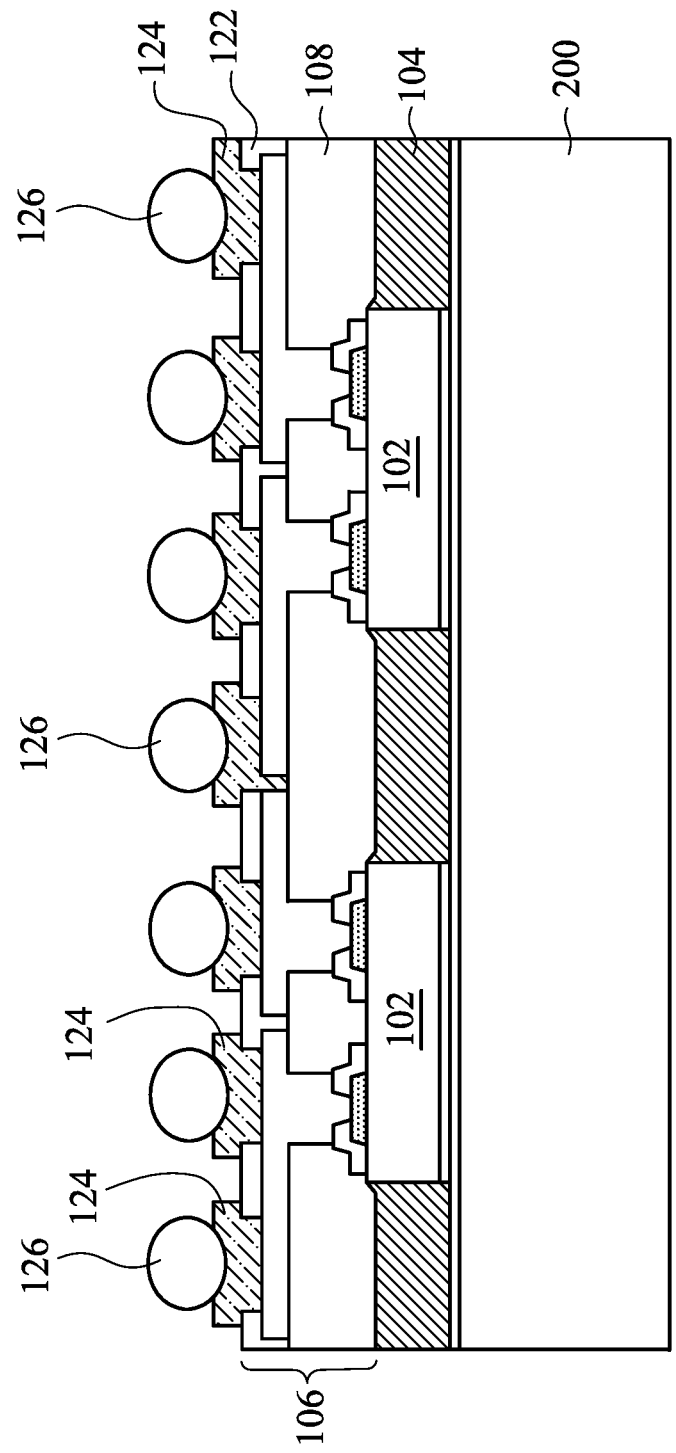

Additional features may be formed over polymer layer 108 and conductive features 120. For example, FIG. 13 illustrates the formation of another polymer layer 122 over polymer layer 108 and conductive features 120. Polymer layer 122 may be formed using any suitable process such as lamination, a spin-on process, and the like. Thus, RDLs 106 are formed over dies 102 and molding compound 104. The number of polymer layers and conductive features of RDLs 106 is not limited to the illustrated embodiment of FIG. 13. For example, RDLs 106 may include any number of stacked, electrically connected conductive features in multiple polymer layers.

As further illustrated by FIG. 13, additional package features, such as external connectors 126 (e.g., BGA balls, C4 bumps, and the like) may be formed over RDLs 106. Connectors 126 may be disposed on UBMs 124, which may also be formed over RDLs 106. Connectors 126 may be electrically connected to one or more dies 102 by way of RDLs 106. Connectors 126 may be used to electrically connect dies 102 to other package components such as another device die, interposers, package substrates, printed circuit boards, a mother board, and the like. Subsequently, carrier 200 may be removed and dies 102 (including corresponding portions of RDLs 106, UBMs 124, and connectors 126) may be singulated along scribe lines using a suitable die saw technique.

Figure 14:
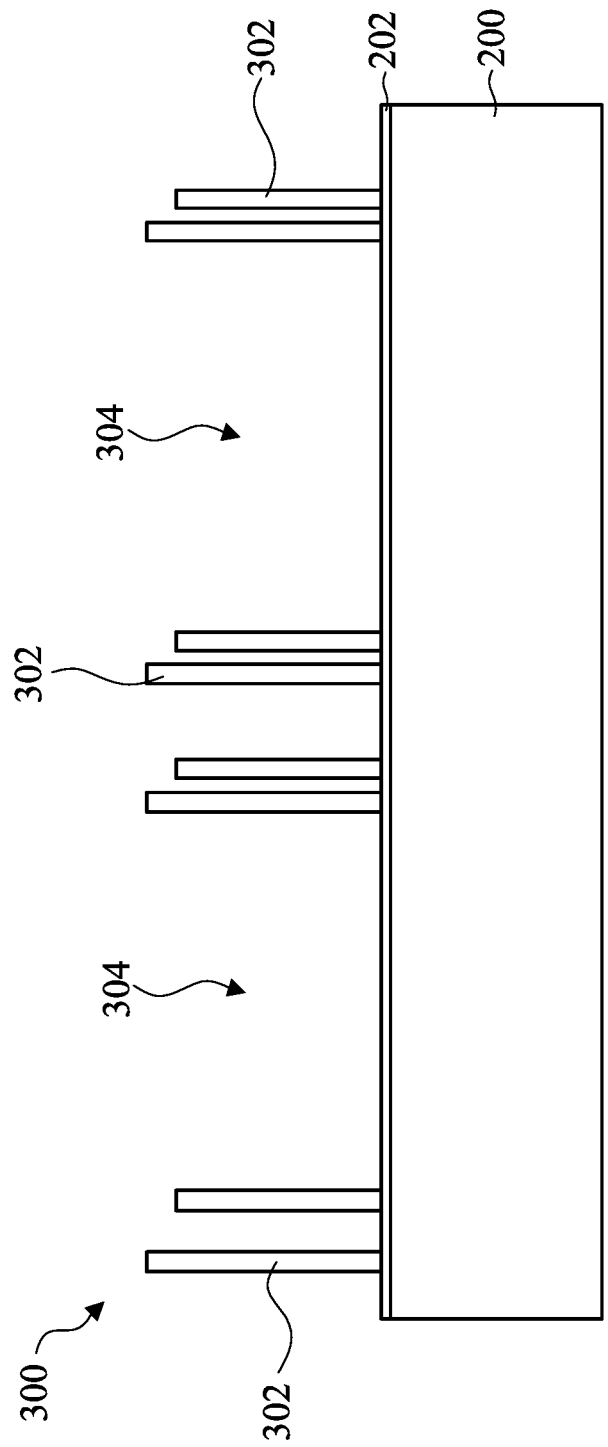
FIGS. 14 through 20 illustrate cross-sectional views of intermediary steps of manufacturing a device package in accordance with some other embodiments.

FIGS. 14 through 20 illustrate cross-sectional views of various intermediary steps of manufacturing a device package having through intervias extending through a molding compound in accordance with some alternative embodiments. In FIG. 14, various through intervias 302 are formed over a carrier substrate 200 (e.g., on adhesive layer 202). Through intervias 302 may comprise copper, nickel, silver, gold, and the like for example, and may be formed by any suitable process. For example, a seed layer (not shown) may be formed over carrier 200, and a patterned photoresist (not shown) having openings may be used to define the shape of through intervias 302. The openings may expose the seed layer, and the openings may be filled with a conductive material (e.g., in an electro-chemical plating process). Subsequently, the photoresist may be removed in an ashing and/or wet strip process, leaving through intervias 302 on carrier 200. Through intervias 302 can also be formed using copper wire stud by copper wire bond processes (e.g., where mask, photoresist, and copper plating are not required). Top surfaces of through intervias 302 may or may not be substantially level. Openings 304 may be disposed between adjacent groups of through intervias 302, and openings 304 may have sufficiently large dimensions to dispose a die 102 therein (see e.g., FIG. 15).

Figure 15:
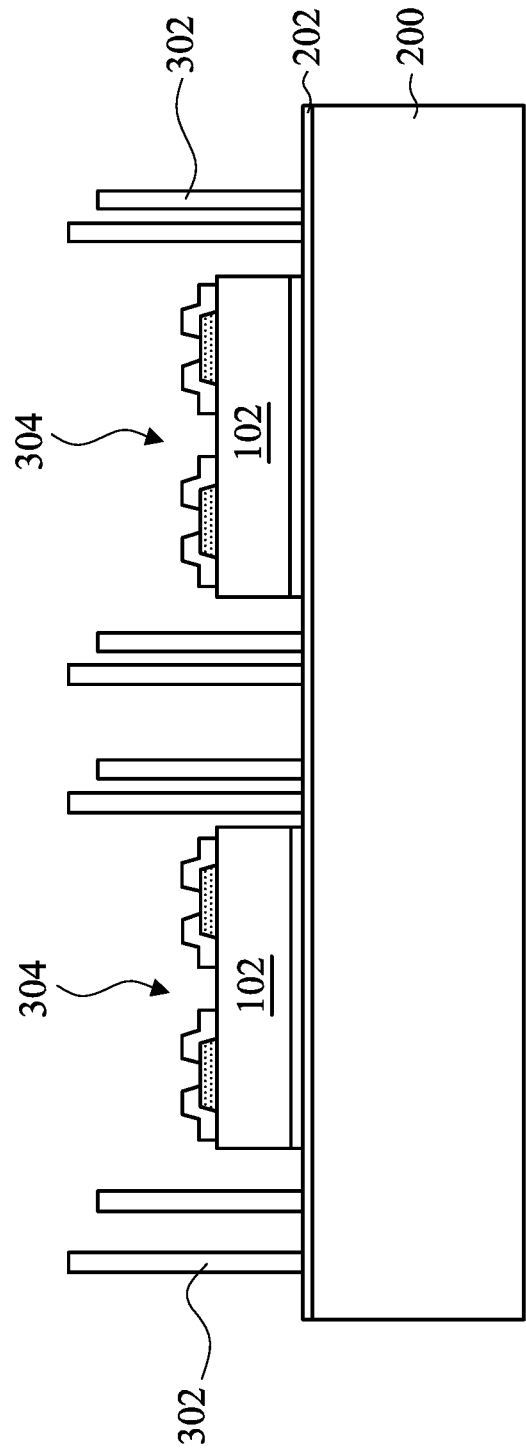
Figure 16:
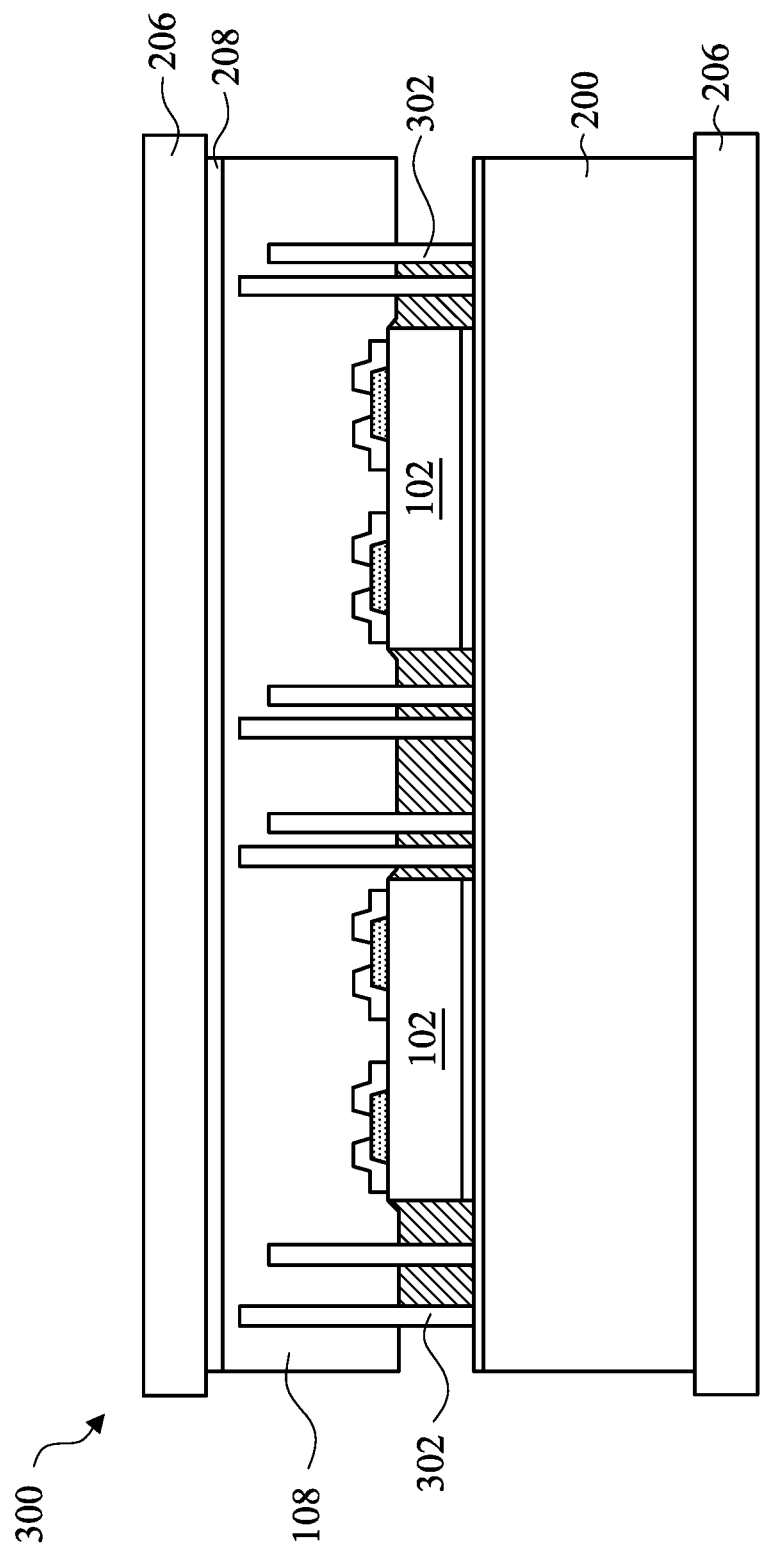
Figure 17:
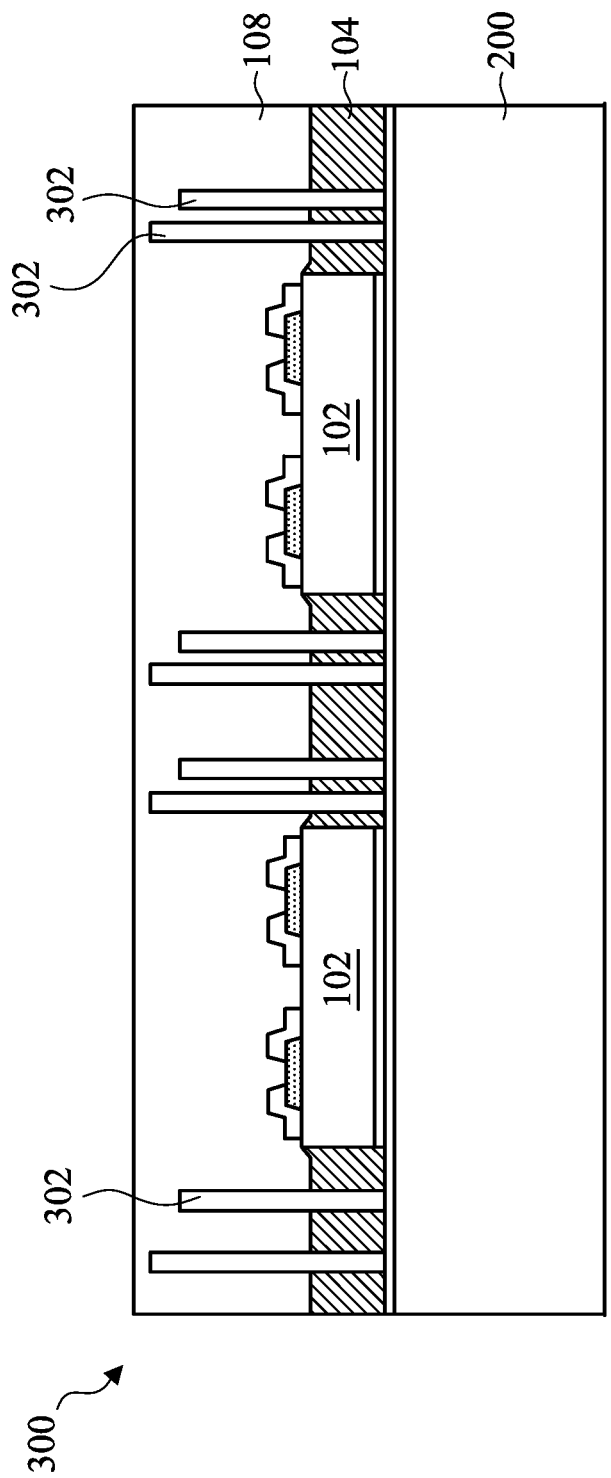

Next in FIG. 15, dies 102 are placed in openings 304 between through intervias 302. Though vias 302 may have a top surface that is higher than a top surface of dies 102. FIGS. 16 and 17 illustrate the formation of molding compound 104 around dies 102 and polymer layer 108 over dies 102. Polymer layer 108 may be thick enough to over top surfaces of through intervias 302. Polymer layer 108 and molding compound 104 may be formed using lamination and transfer molding techniques such as the methods described by FIGS. 2 through 5 (e.g., where polymer layer 108 is formed prior to molding compound 104) or FIGS. 6 through 8, for example (e.g., where polymer layer 108 is formed after molding compound 104). The formation of polymer layer 108 may further include a pressure clamping process (e.g., using top and/or bottom plates 206) to planarize a top surface of polymer layer 108.

Figure 18:
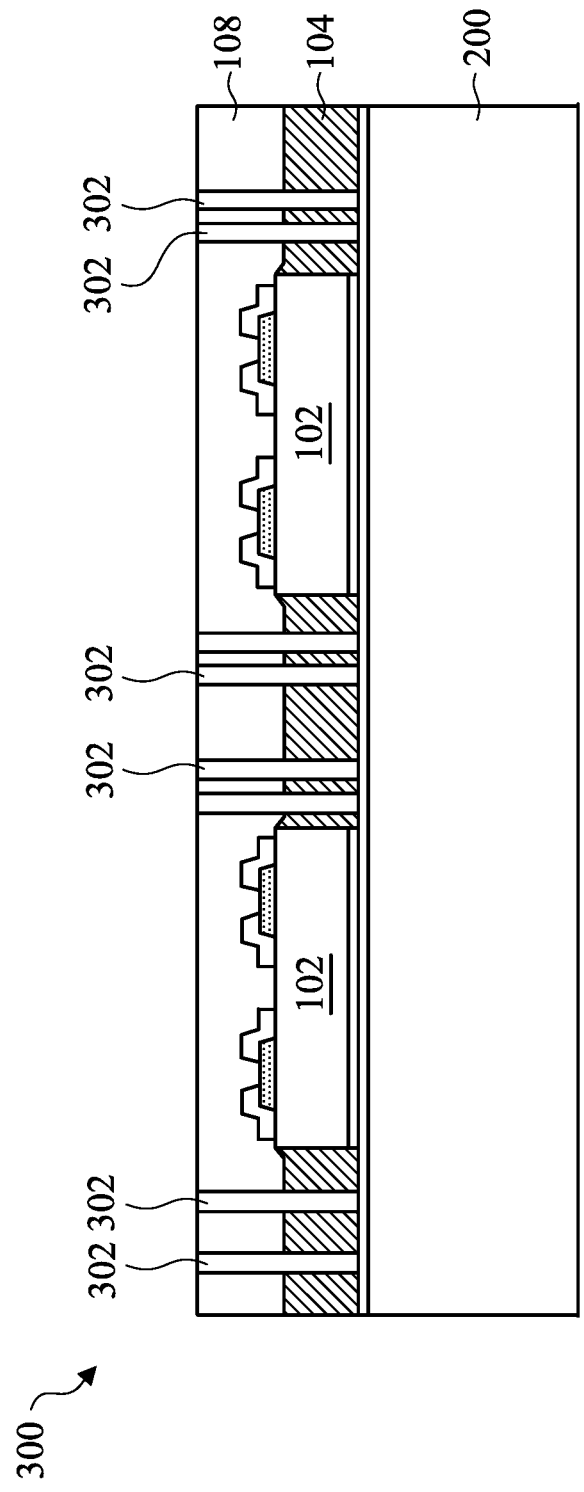
Figure 19:
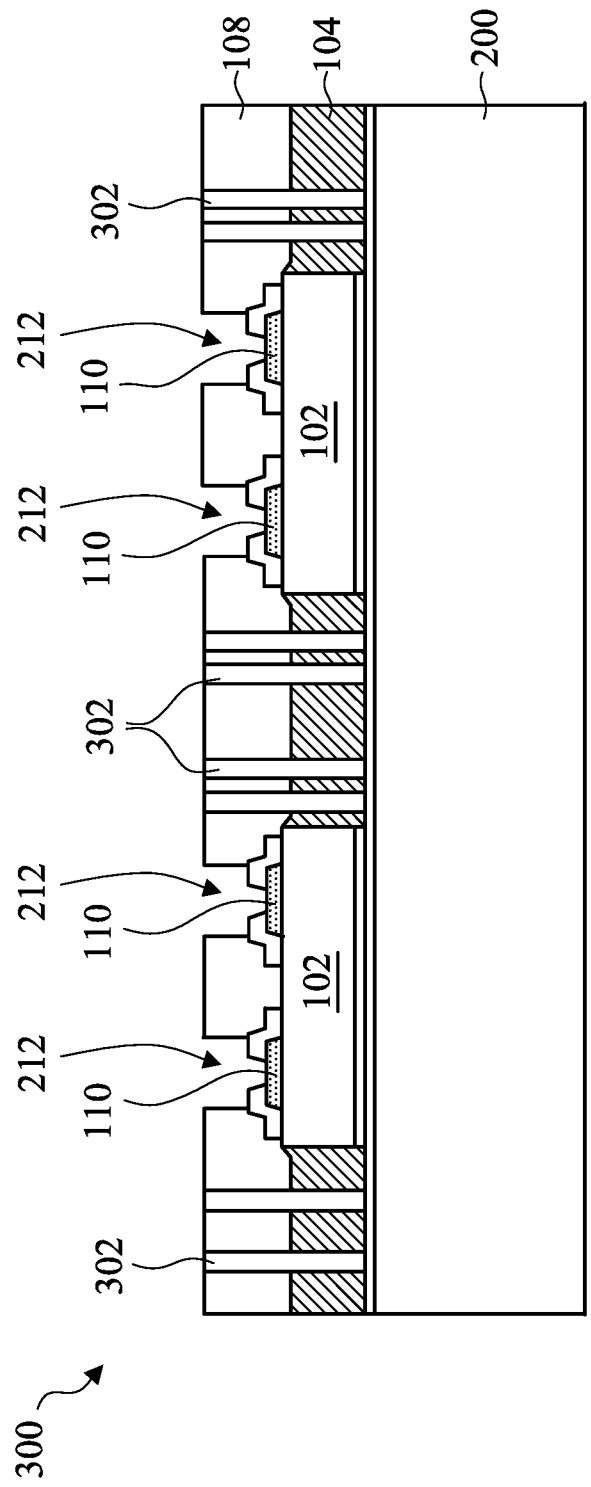

In FIG. 18, a thinning process may be performed on polymer layer 108 to expose through intervias 306. For example, a grinding, CMP, fly cutting process, or other etch back technique may be applied to the top surface of polymer layer 108 to expose through intervias 306. In FIG. 19, openings 212 are patterned (e.g., through laser drilling, photolithography, and/or etching techniques) in polymer layer 108 to expose contact pads 110 of dies 102.

Figure 20:
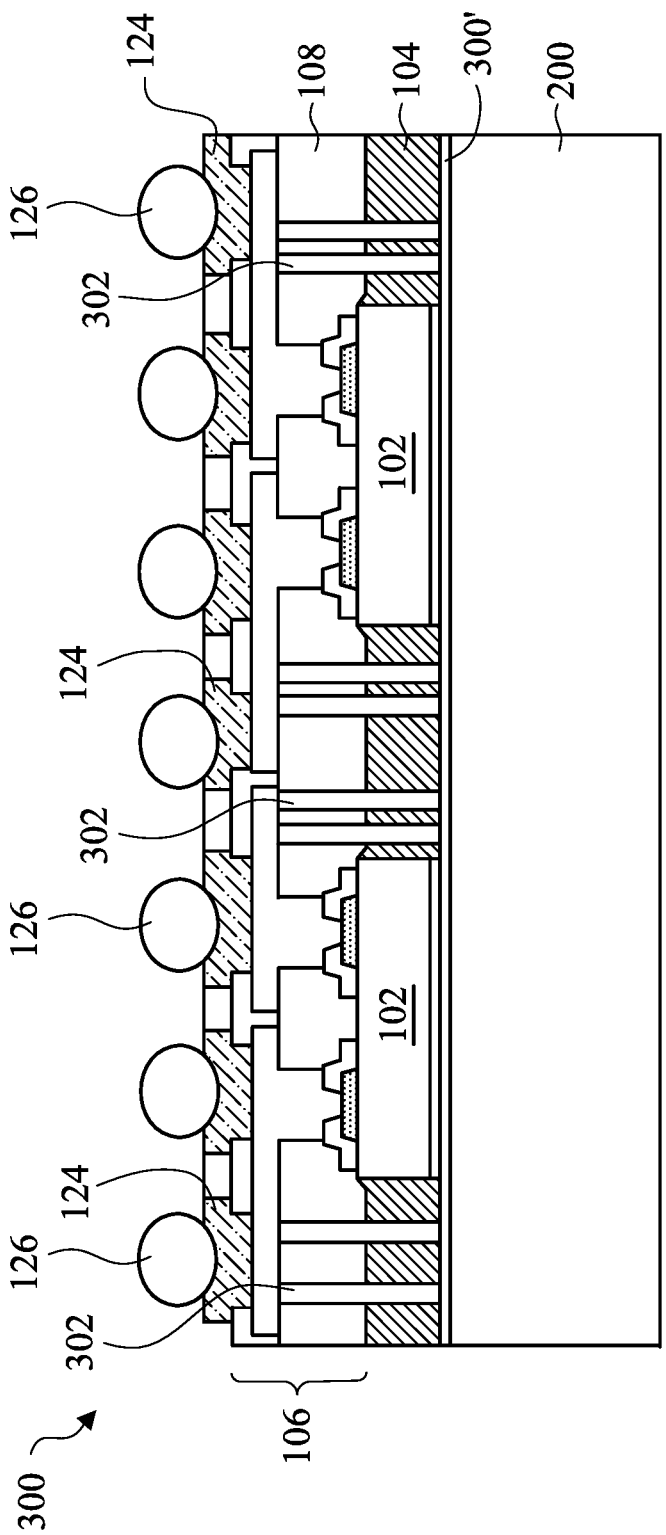

Subsequently, in FIG. 20, other features of RDLs 106 are formed over polymer layer 108. For example, conductive features 120 and additional polymer layer(s) 122 are formed over polymer layer 108. As further illustrated by FIG. 20, additional package features, such as external connectors 126 (e.g., BGA balls, C4 bumps, and the like) on UBMs 124 may be formed over RDLs 106. Connectors 126 may be electrically connected to one or more dies 102 and/or through intervias 302 by RDLs 106. Subsequently, carrier 200 may be removed and dies 102 (including corresponding through intervias 302 and portions of RDLs 106, UBMs 124, and connectors 126) may be singulated along scribe lines using a suitable die saw technique. In some embodiments, additional features (e.g., additional RDLs, connectors, heat dissipation features, and the like) may be formed on a backside (e.g., side 300') of package 100, and through intervias 302 may be used to provide electrical connection between front side RDLs 106 and such features on the backside of package 300. Thus, a device package 300 having through intervias extending through molding compound 104 is formed using transfer molding and lamination processes.

Figure 21A:
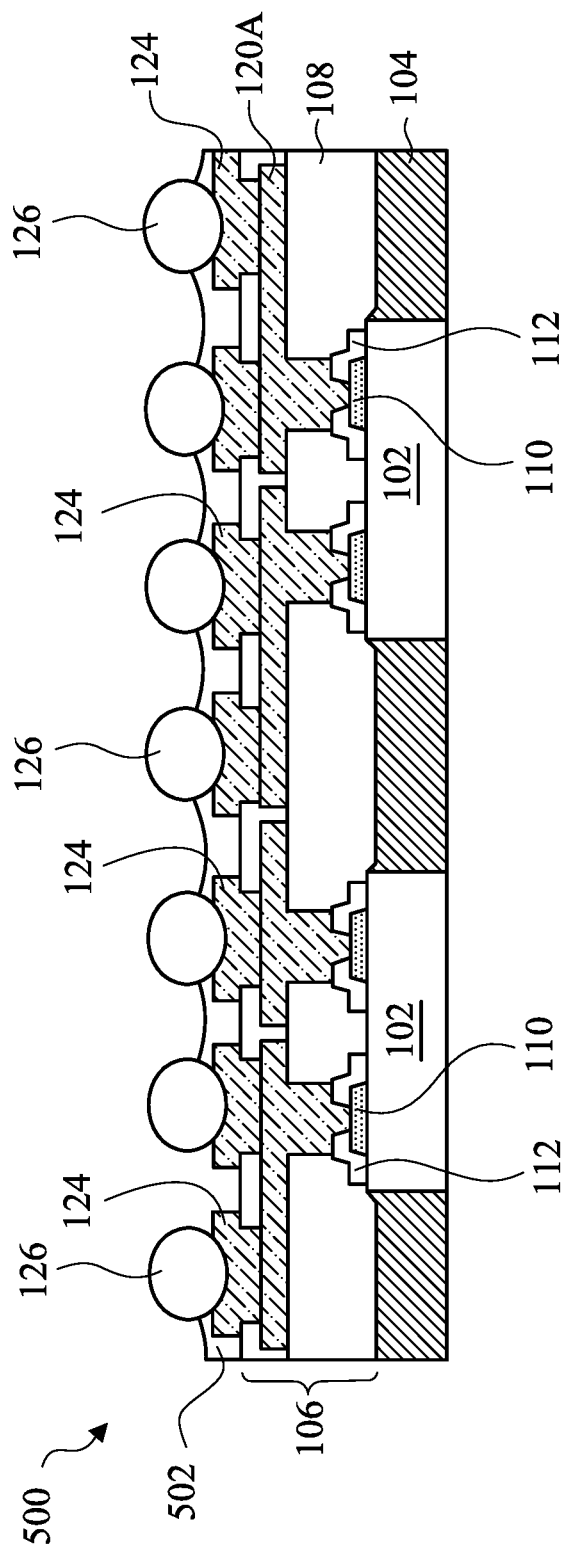
FIGS. 21A and 21B illustrate cross-sectional views of a device package in accordance with some alternative embodiments.
Figure 21B:
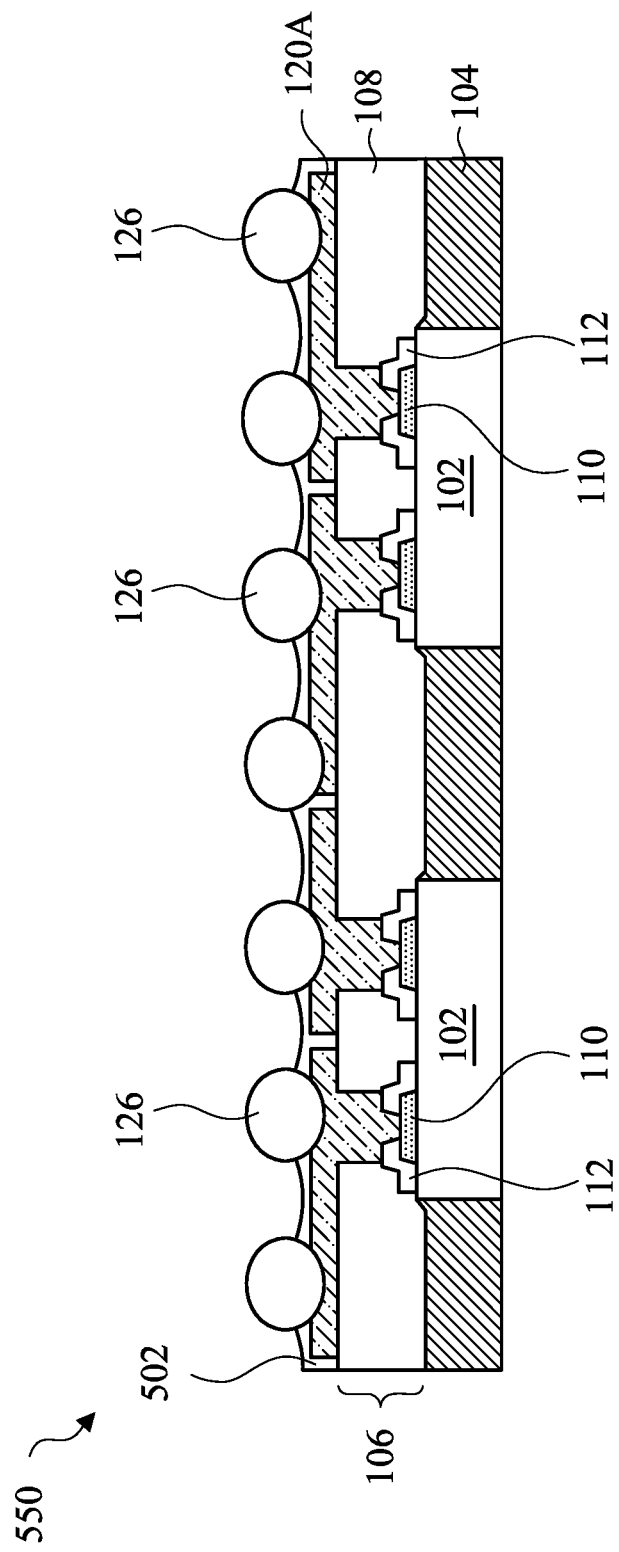

FIGS. 21A and 21B illustrate cross-sectional views of a device package 500 and 550, respectively, according to an alternative embodiment. Packages 500 and 550 may be substantially similar to package 100 where like reference numerals indicate like elements. For example, a molding compound 104 may be formed around dies 102 using a transfer molding process as described above, and RDLs 106 having a first polymer layer 108 may be formed over molding compound 104. The formation process for polymer layer 108 may result in polymer layer 108 having a substantially planar top surface (e.g., as a result of a lamination process including pressure clamping). RDLs 106 may further include various conductive features 120 (e.g., conductive vias 120B and conductive lines 120A) that are electrically connect to dies 102, and external connectors 126 may be formed over and electrically connect to such conductive features 120. FIG. 21A illustrates an embodiment where UBMs 124 are formed also over conductive features 120 and connectors 126 are disposed on UBMs 124. In some embodiments, one or more additional passivation layers (not shown) may also be formed over RDLs 106 with some of these additional passivation layers optionally covering edges of UBMs 124. Alternatively, as illustrated by FIG. 21B, UBMs 124 may be omitted, and connectors 126 may be disposed directly on conductive lines 120A in RDLs 106.

As further included in packages 500 and 550, a molded underfill 502 may be formed around connectors 126 to provide structural support to connectors 126 and/or protection to underlying device layers (e.g., RDLs 106). In some embodiments, molded underfill 502 is formed using substantially similar processes as molding compound 104. For example, molded underfill 502 may be formed using a transfer molding process as described above prior to the attachment of connectors 126. As a result, a top surface of molded underfill 502 may be non-planar. Subsequently, molded underfill 502 may be patterned (e.g., using photolithography, laser drilling, and/or etching techniques) to expose underlying UBMs 124 (e.g., as illustrated by FIG. 21A) or conductive lines 120A (e.g., as illustrated by FIG. 21B), and connectors 126 may be placed on such conductive features.

Figure 22:
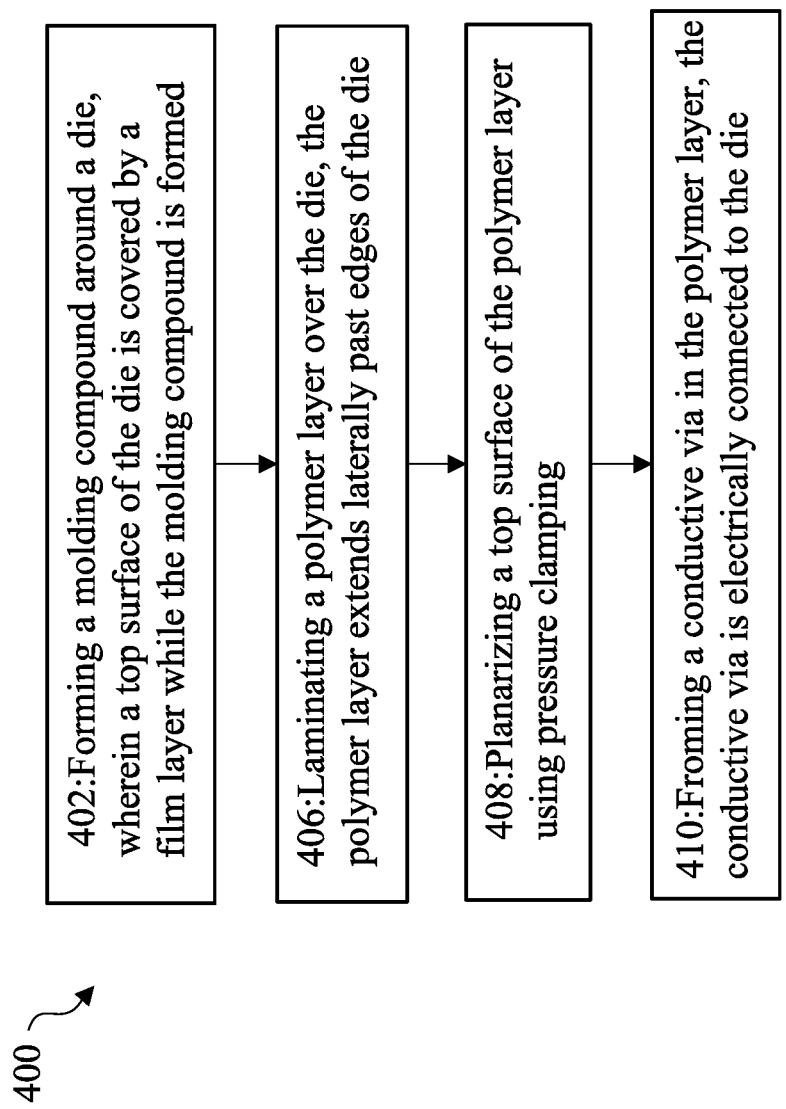
FIG. 22 illustrates a process flow for forming a device package in accordance with some embodiments.

FIG. 22 illustrates a process flow 400 for forming a device package in accordance with various embodiments. In step 402, a molding compound (e.g., molding compound 104) is formed around a die (e.g., die 102) using transfer molding processes, for example. The molding compound may not extend over or cover a top surface of the die. For example, a top surface of the die may be covered by a film layer (e.g., lamination film layer or a release film layer) while the molding compound is formed. In step 406, a polymer layer (e.g., polymer layer 108) is laminated over top surfaces of the die. The polymer layer may extend laterally past edges of the die. In some embodiments, the polymer layer formed prior to the molding compound (step 402), and the polymer layer may be used as the film layer covering top surfaces of the die during molding. In other embodiments, the polymer layer is formed after the molding compound, and the film layer used during molding is a release film layer, which is removed prior to the formation of the polymer layer.

In step 408, a top surface of the polymer layer is planarized through pressure clamping. For example, the pressure clamping by a molding apparatus or by a separate lamination apparatus. In some embodiments, pressure clamping may be performed during the lamination process (e.g., during a curing process for adhering the polymer to top surfaces of the die). Alternatively or additionally, pressure clamping may be performed separately from lamination. Next, in step 410, a conductive via (e.g., via 120B) is formed in the polymer layer, the conductive via is electrically connected to the die (e.g., electrically connected to a contact pad 110 in die 102). Other features such as additional polymer layers, conductive features (e.g., conductive lines, conductive vias, and/or through intervias extending through the molding compound), UBMs, external connectors, and the like and the like may also be formed.

A method for forming a fan-out device package and corresponding structure are disclosed. In some embodiments, a molding compound is formed around a die using a transfer molding process where a top surface of the die is covered by a film layer during the molding process. The molding compound may not be formed to cover a top surface of the die, and a grinding process (or other etch back technique) need not be performed on the molding compound to expose the die, simplifying the molding process and reducing manufacturing cost. Due to the transfer molding process, a top surface of the molding compound may have a TTV of about 5 µm to about 10 µm.

A first RDL, such as a polymer layer (e.g., a lamination film material), is formed over the molding compound and the die using a lamination process (e.g., vacuum lamination, heat roll lamination, or the like). In some embodiments, the polymer layer is used as the film layer during molding. Alternatively, the polymer layer may be formed after the molding compound. The lamination process may further include pressure clamping to provide a substantially planar top surface for the polymer layer suitable for forming various fan-out structures over the die. A bottom surface of the polymer layer contacting the molding compound may have a corresponding profile and TTV as the molding compound. Thus, a fan-out device package may be formed using transfer molding and lamination processes, which may reduce overall costs of manufacturing the package.

Although FIG. 3 through FIGS. 21A and 21B, discussed above, depict two similar dies 102, the discussion above regarding each of these Figures is also applicable to embodiments with two or more dies with different dimensions. For example, FIGS. 23-26 depict device packages in accordance with some embodiments where the device packages include two dies with one or more different dimensions.

FIGS. 23-26 depict contact pads 110 disposed on a top surface of each of first die 102A and second die 102B. In all Figures, the placement of contact pads 110 is for purposes of illustration only. Contact pads 110 in each depicted device package may include each of the embodiments depicted in any of the Figures or described herein.

Figure 23:
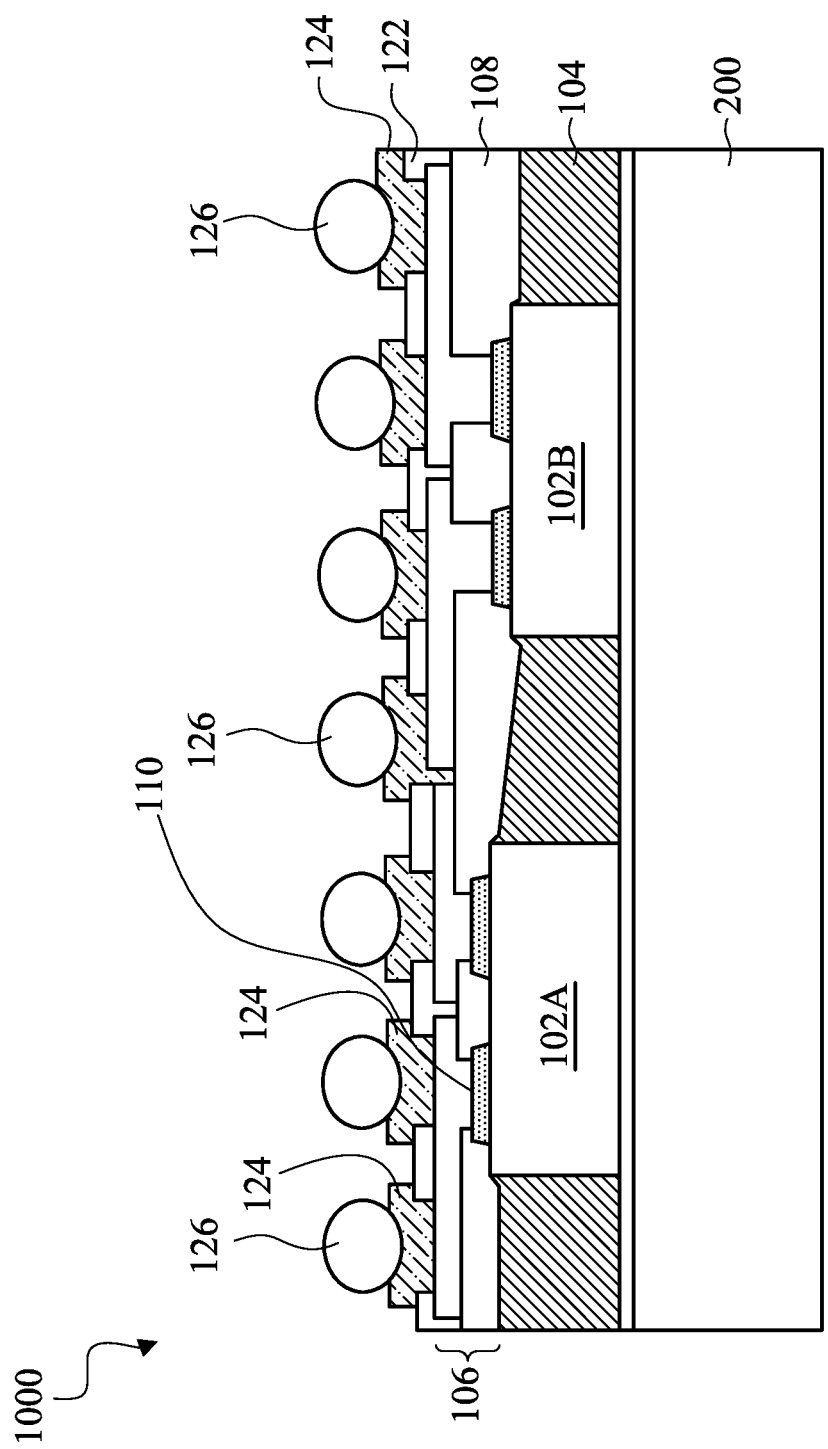
FIGS. 23 through 26 illustrate cross-sectional views of a device package in accordance with some embodiments.

Referring to FIG. 23, a cross section of device package 1000 is shown in accordance with some embodiments. Device package 1000 includes first die 102A and second die 102B, where first die 102A has a different height than second die 102B. The height of first die 102A and second die 102B may be measured along a sidewall of first die 102A and second die 102B respectively. In some embodiments, a height difference between first die 102A and second die 102B may be 2 µm or more. First die 102A may be a same type of die as second die 102B, or first die 102A may be a different type of die than second die 102B.

Device package 1000 may be formed using processes that are the same or similar to those described above in connection with device package 100. For example, as described earlier in connection with FIGS. 2-5, polymer layer 108 may be placed over first die 102A and second die 102B, and cured so that polymer layer 108 adheres to first die 102A and 102B. Afterwards, a transfer molding process may be formed as described above. Alternatively, as described earlier in connection with FIGS. 6-8, a film 208 may be placed over first die 102A and second die 102B during the transfer molding process, and polymer layer may be subsequently formed over molding compound 104. Due to the transfer molding process, and the height difference between first die 102A and second die 102B, a top surface of molding compound 104 may not be level, as shown in FIG. 23. As described in FIGS. 9-13, additional processing may be performed, for example to form RDLs 106, UBMs 124 and external connectors 126.

Figure 24:
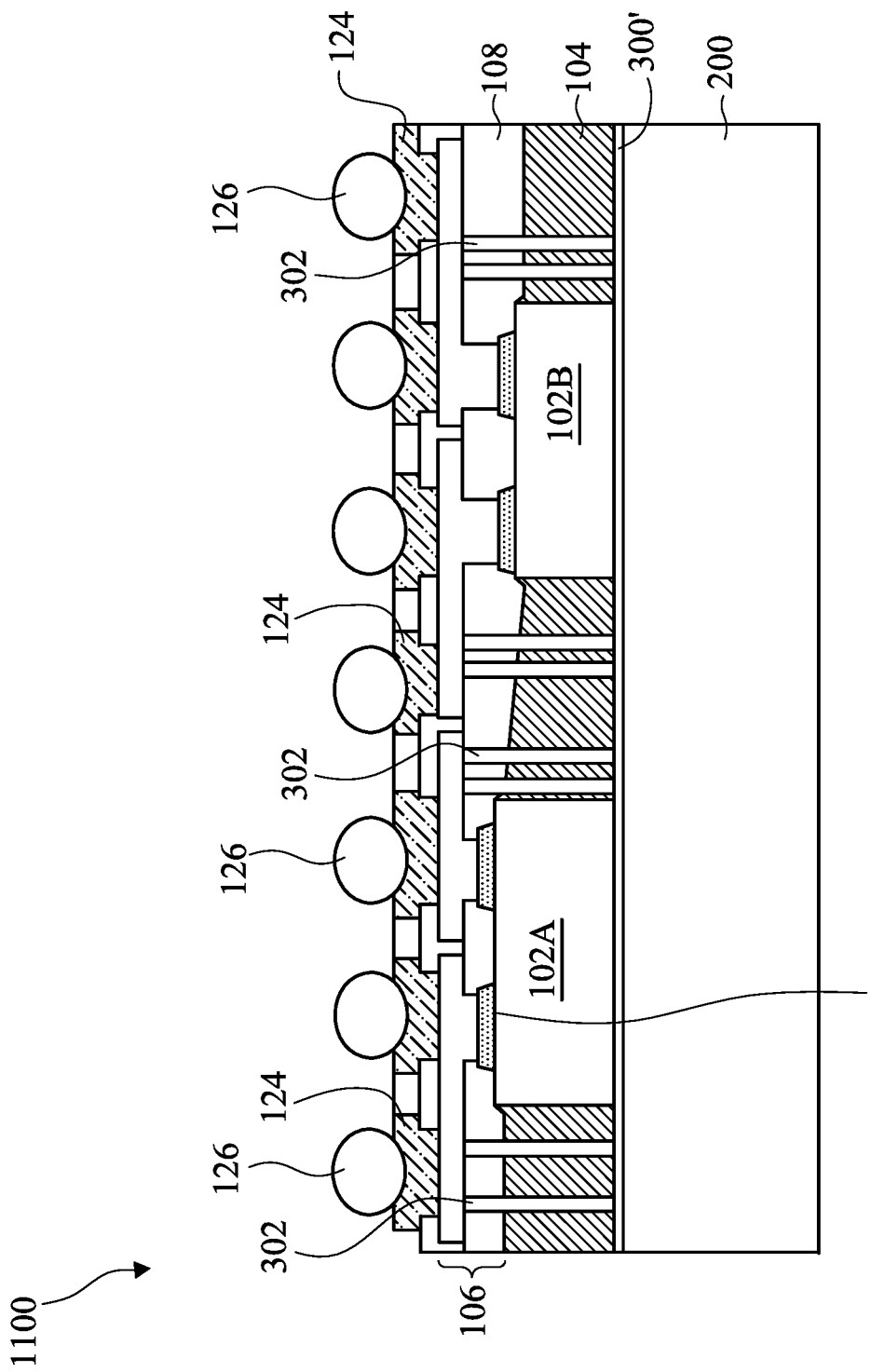

Referring to FIG. 24, a cross section of device package 1100 is shown in accordance with some embodiments. Device package 1100 includes first die 102A and second die 102B, where first die 102A has a different height than second die 102B. The height of first die 102A and second die 102B may be measured along a sidewall of first die 102A and second die 102B respectively. In some embodiments, a height difference between first die 102A and second die 102B may be 2 µm or more. First die 102A may be a same type of die as second die 102B, or first die 102A may be a different type of die than second die 102B.

Device package 1100 may have one more through intervias 302 extending through the molding compound 104. For example, as described earlier in connection with FIGS. 14-20, in some embodiments through intervias 302 may be formed on a carrier, and first die 102A and second die 102B may be placed on the carrier. Polymer layer 108 may be formed over upper ends of the through intervias 302, and a transfer molding process may be performed. Due to the transfer molding process, and the height difference between first die 102A and second die 102B, a top surface of molding compound 104 may not be level, as shown in FIG. 24. Polymer layer 108 and through intervias 302 may then be thinned. Additional processing may be performed as described above, for example to form RDLs 106, UBMs 124 and external connectors 126.

Figure 25:
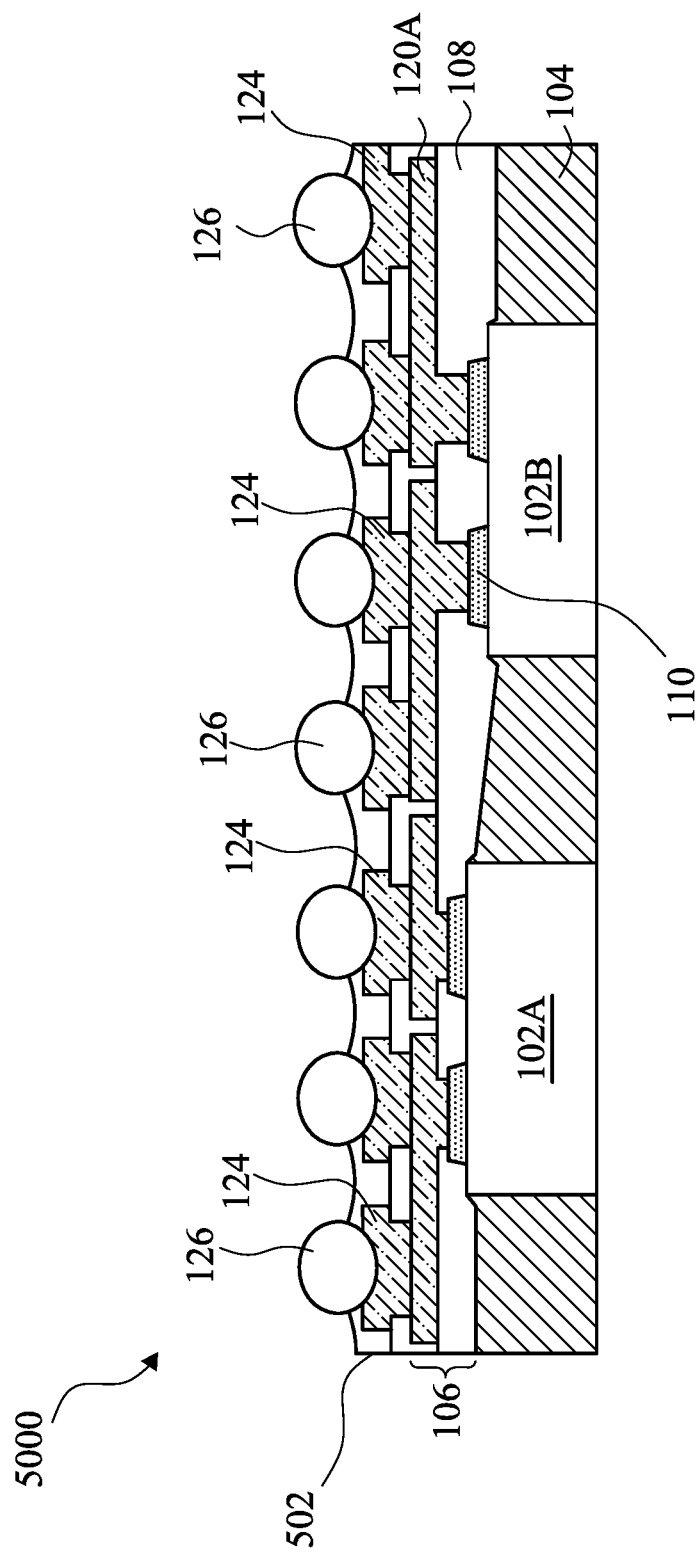

Referring to FIG. 25, a cross section of device package 5000 is shown in accordance with some embodiments. FIG. 25 depicts device package 5000 that includes first die 102A and second die 102B, where first die 102A has a different height than second die 102B. The height of first die 102A and second die 102B may be measured along a sidewall of first die 102A and second die 102B respectively. In some embodiments, a height difference between first die 102A and second die 102B may be 2 µm or more. First die 102A may be a same type of die as second die 102B, or first die 102A may be a different type of die than second die 102B.

Device package 5000 may formed using the same or similar processes to those described in connection with device package 100 and device package 500. For example, as described above in connection with FIG. 21A, in some embodiments a molded underfill 502 may be formed around connectors 126 to provide structural support to connectors 126 and/or protection to underlying device layers (e.g., RDLs 106). In some embodiments, molded underfill 502 is formed using substantially similar processes as molding compound 104. For example, molded underfill 502 may be formed using a transfer molding process as described above prior to the attachment of connectors 126. As a result, a top surface of molded underfill 502 may be non-planar. Subsequently, molded underfill 502 may be patterned (e.g., using photolithography, laser drilling, and/or etching techniques) to expose underlying UBMs 124, and connectors 126 may be placed on such conductive features.

Figure 26:
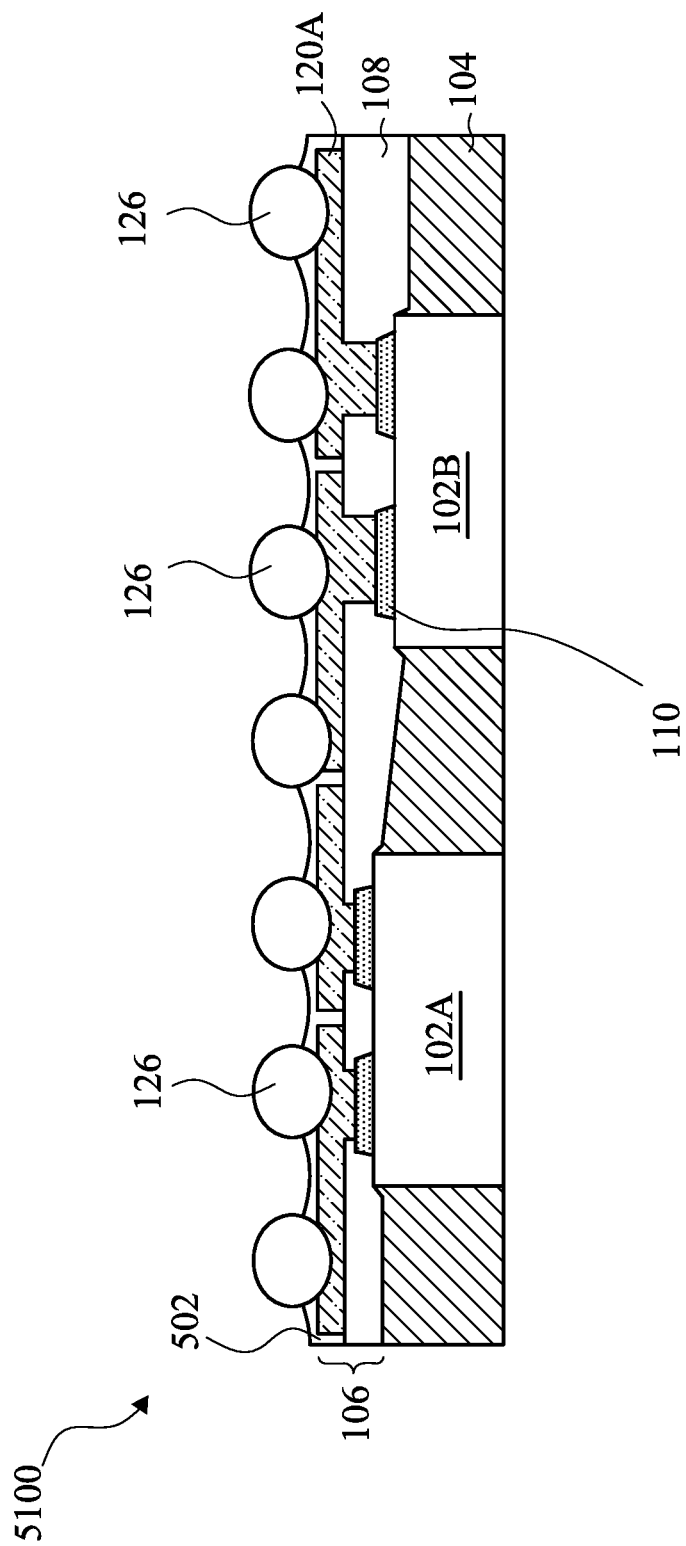

Referring to FIG. 26, a cross section of device package 5100 is shown in accordance with some embodiments. FIG. 26 depicts device package 5100 that includes first die 102A and second die 102B, where first die 102A has a different height than second die 102B. The height of first die 102A and second die 102B may be measured along a sidewall of first die 102A and second die 102B respectively. In some embodiments, a height difference between first die 102A and second die 102B may be 2 µm or more. First die 102A may be a same type of die as second die 102B, or first die 102A may be a different type of die than second die 102B.

Device package 5100 may formed using the same or similar processes to those described in connection with device package 100 and device package 550. For example, as described above in connection with FIG. 21B, in some embodiments a molded underfill 502 may be formed around connectors 126 to provide structural support to connectors 126 and/or protection to underlying device layers (e.g., RDLs 106). In some embodiments, molded underfill 502 is formed using substantially similar processes as molding compound 104. For example, molded underfill 502 may be formed using a transfer molding process as described above prior to the attachment of connectors 126. As a result, a top surface of molded underfill 502 may be non-planar. Subsequently, molded underfill 502 may be patterned (e.g., using photolithography, laser drilling, and/or etching techniques) to expose underlying connective lines 120A, and connectors 126 may be placed on such conductive features.

In accordance with an embodiment, a method for forming a device package includes forming a molding compound around a die and laminating a polymer layer over the die. A top surface of the die is covered by a film layer while the molding compound is formed, and the polymer layer extends laterally past edge portions of the die. The method further includes forming a conductive via in the polymer layer, wherein the conductive via is electrically connected to a contact pad at a top surface of the die.

In accordance with another embodiment, a method for forming a device package includes disposing a die on a carrier, transfer molding a molding compound over the carrier and extending along sidewalls of the die, and forming a polymer layer over the die. A top surface of the die is covered by a film layer during the transfer molding, and forming the polymer layer includes pressure clamping a top surface of the polymer layer. The method further includes forming a conductive feature at least partially in the polymer layer and forming an external connector over and electrically connected to the conductive feature. The conductive feature is electrically connected to a contact pad at the top surface of the die.

In accordance with yet another embodiment, a device package includes a die, a molding compound extending along sidewalls of the die, and a polymer layer contacting top surfaces of the molding compound and the die. At least a portion of the top surface of the molding compound comprises an inclined surface, and a top surface of the polymer layer is substantially level. The device package further includes a conductive feature in the polymer layer, wherein the conductive feature is electrically connected to the die.

In accordance with another embodiment, a device package includes a first die and a second die. A top surface of the first die is vertically offset from a top surface of the second die relative to a major surface of the first die. A molding compound extends along sidewalls of the first die and the second die. At least a portion of a top surface of the molding compound includes an inclined surface, the portion of the top surface being between the first die and the second die. A polymer layer contacts the top surface of the molding compound, the top surface of the first die, and the top surface of the second die. A top surface of the polymer layer is substantially level. The device package includes a first conductive feature in the polymer layer. The conductive feature is electrically connected to the first die.

In accordance with yet another embodiment, a method includes placing a first die and a second die on a substrate. A height of the first die is different than a height of the second die, where the height of the first die is a shortest distance from a surface of the substrate to a furthermost surface of the first die from the substrate, and the height of the second die is a shortest distance from the surface of the substrate to a furthermost surface of the second die from the substrate. The method also includes forming a molding compound along sidewalls of the first die and the second die. A top surface of the first die and a top surface of the second die is covered by a film layer while the molding compound is formed. The method also includes laminating a polymer layer over the first die and the second die. The polymer layer extends laterally past edge portions of the first die and the second die. The method also includes forming a first conductive via in the polymer layer. The first conductive via is electrically connected to a contact pad at a top surface of the first die. The method also includes\ forming a second conductive via in the polymer layer. The second conductive via is electrically connected to a contact pad at a top surface of the second die.

In accordance with yet another embodiment, a method includes placing a plurality of dies on a substrate. A first thickness of a first die is different than a second thickness of a second die. The method includes transfer molding a molding compound over the substrate and extending along sidewalls of each of the plurality of dies. The top surface of each of the plurality of dies is covered by a film layer during the transfer molding. The method includes forming a polymer layer over the plurality of dies. The method also includes forming a conductive feature at least partially in the polymer layer. The conductive feature is electrically connected to a contact pad of one of the plurality of dies. The method also includes forming an external connector over and electrically connected to the conductive feature.

In an embodiment, a device package includes a first die and a second die, a top surface of the first die being offset from a top surface of the second die in a direction that is parallel to a sidewall of the first die, a molding compound extending along sidewalls of the first die and the second die, where at least a portion of a top surface of the molding compound comprises an inclined surface, the portion of the top surface of the molding compound being between the first die and the second die. The device package also includes a polymer layer contacting the top surface of the molding compound, the top surface of the first die, and the top surface of the second die. The device package also includes a first conductive feature in the polymer layer, where the first conductive feature is electrically connected to the first die. In an embodiment, the top surface of the first die is offset from the top surface of the second die by 2 μm or more. In an embodiment, the polymer layer comprises polyimide, PBO, epoxy, an underfill film, a molded underfill film, or a combination thereof. In an embodiment, the polymer layer comprises a filler material. In an embodiment, the molding compound has a total thickness variation of about 5 μm to about 10 μm. In an embodiment, the device package also includes a through intervia extending through the molding compound. In an embodiment, top surfaces of the through intervia and the polymer layer are substantially level. In an embodiment, a thickness of the molding compound disposed on a first side of the through intervia is greater than a thickness of the molding compound being disposed on a second side of the through intervia, the second side being opposite to the first side. In an embodiment, the device package also includes a plurality of connectors disposed over the polymer layer, a molded underfill extending along sidewalls of each of the plurality of connectors, a top surface of the polymer layer being substantially level.

In an embodiment, a package includes a first die having a first thickness and a second die having a second thickness, the first thickness being larger than the second thickness. The package may also include a molding material extending along sidewalls of the first die and the second die, where a thickness of the molding material adjacent to the first die is a third thickness, a thickness of the molding material adjacent to the second die is a fourth thickness, and the third thickness is larger than the fourth thickness. The package may also include a polymer layer over and contacting the first die, the second die and the molding material. The package may also include a conductive feature in the polymer layer, where the conductive feature is electrically connected to the first die. In an embodiment, a portion of a top surface of the molding material is below a top surface of the first die and above a surface of the second die. In an embodiment, a thickness of a first portion of the polymer layer is less than a thickness of a second portion of the polymer layer, the first portion overlying the first die and the second portion overlying the second die. In an embodiment, a bottom surface of the polymer layer is angled with respect to a top surface of the polymer layer. In an embodiment, a first portion of a bottom surface of the polymer layer extends at a first angle with respect to a top surface of the polymer layer, and a second portion of the polymer layer extends at a second angle with respect to the top surface of the polymer layer, the first angle being different than the second angle, and the first portion of the polymer layer and the second portion of the polymer layer overlying a space between the first die and the second die.

In an embodiment, a package includes a first die and a second die, a first height of the first die being different from a second height of the second die by 2 µm or more, where the first height and the second height are measured along sidewalls of the first die and the second die. The package may also include a molding material extending along sidewalls of the first die and the second die, where at least a portion of a top surface of the molding material is non-planar. The package may also include a polymer layer contacting the top surface of the molding material, where a first portion of a bottom surface of the polymer layer extends at a first angle with respect to the top surface of the polymer layer, and a second portion of the polymer layer extends at a second angle with respect to a top surface of the polymer layer, the first angle being different than the second angle. The package may also include a conductive feature extending through the polymer layer to contact the second die. In an embodiment, a top surface of the polymer layer is substantially level. In an embodiment, the first portion and the second portion overlie a space between the first die and the second die. In an embodiment, a third portion of the bottom surface of the polymer layer extends at a third angle with respect to the top surface of the polymer layer, the third angle being different than the second angle, and the third portion being non-adjacent to the first portion. In an embodiment, the package includes a through via extending through the molding material. In an embodiment, a thickness of the molding material extending along a first sidewall of the through via is different than a thickness of the molding material extending along a second sidewall of the through via opposite the first sidewall of the through via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package, comprising:
  a first die and a second die, a top surface of the first die being offset from a top surface of the second die in a direction that is parallel to a sidewall of the first die;
  a molding compound extending along sidewalls of the first die and the second die, wherein at least a portion of a top surface of the molding compound comprises an inclined surface, the portion of the top surface of the molding compound being between the first die and the second die;
  a polymer layer contacting the top surface of the molding compound, the top surface of the first die, and the top surface of the second die; and
  a first conductive feature in the polymer layer, wherein the first conductive feature is electrically connected to the first die.

2. The device package of claim 1, wherein the top surface of the first die is offset from the top surface of the second die by 2 µm or more.

3. The device package of claim 1, wherein the polymer layer comprises polyimide, PBO, epoxy, an underfill film, a molded underfill film, or a combination thereof.

4. The device package of claim 1, wherein the polymer layer comprises a filler material.

5. The device package of claim 1, wherein the molding compound has a total thickness variation of about 5 µm to about 10 µm.

6. The device package of claim 1, further comprising a through intervia extending through the molding compound.

7. The device package of claim 6, wherein top surfaces of the through intervia and the polymer layer are substantially level.

8. The device package of claim 6, wherein a thickness of the molding compound disposed on a first side of the through intervia is greater than a thickness of the molding compound being disposed on a second side of the through intervia, the second side being opposite to the first side.

9. The device package of claim 1, further comprising a plurality of connectors disposed over the polymer layer, a molded underfill extending along sidewalls of each of the plurality of connectors, a top surface of the polymer layer being substantially level.

10. A package, comprising:
  a first die having a first thickness;
  a second die having a second thickness, the first thickness being larger than the second thickness;
  a molding material extending along sidewalls of the first die and the second die, wherein a thickness of the molding material adjacent to the first die is a third thickness, a thickness of the molding material adjacent to the second die is a fourth thickness, and the third thickness is larger than the fourth thickness;
  a polymer layer over and contacting the first die, the second die and the molding material; and
  a conductive feature in the polymer layer, wherein the conductive feature is electrically connected to the first die.

11. The package according to claim 10, wherein a portion of a top surface of the molding material is below a top surface of the first die and above a surface of the second die.

12. The package according to claim 10, wherein a thickness of a first portion of the polymer layer is less than a thickness of a second portion of the polymer layer, the first portion overlying the first die and the second portion overlying the second die.

13. The package according to claim 10, wherein a bottom surface of the polymer layer is angled with respect to a top surface of the polymer layer.

14. The package according to claim 10, wherein a first portion of a bottom surface of the polymer layer extends at a first angle with respect to a top surface of the polymer layer, and a second portion of the polymer layer extends at a second angle with respect to the top surface of the polymer layer, the first angle being different than the second angle, and the first portion of the polymer layer and the second portion of the polymer layer overlying a space between the first die and the second die.

15. A package, comprising:
- a first die and a second die, a first height of the first die being different from a second height of the second die by 2 μm or more, wherein the first height and the second height are measured along sidewalls of the first die and the second die;
- a molding material extending along sidewalls of the first die and the second die, wherein at least a portion of a top surface of the molding material is non-planar;
- a polymer layer contacting the top surface of the molding material, wherein a first portion of a bottom surface of the polymer layer extends at a first angle with respect to the top surface of the polymer layer, and a second portion of the polymer layer extends at a second angle with respect to a top surface of the polymer layer, the first angle being different than the second angle; and
- a conductive feature extending through the polymer layer to contact the second die.

16. The package according to claim 15, wherein a top surface of the polymer layer is substantially level.

17. The package according to claim 15, wherein the first portion and the second portion overlie a space between the first die and the second die.

18. The package according to claim 15, wherein a third portion of the bottom surface of the polymer layer extends at a third angle with respect to the top surface of the polymer layer, the third angle being different than the second angle, and the third portion being non-adjacent to the first portion.

19. The package according to claim 15, further comprising a through via extending through the molding material.

20. The package according to claim 19, wherein a thickness of the molding material extending along a first sidewall of the through via is different than a thickness of the molding material extending along a second sidewall of the through via opposite the first sidewall of the through via.

* * * * *